United States Patent
Cook et al.

(10) Patent No.: US 11,451,248 B2
(45) Date of Patent: *Sep. 20, 2022

(54) FRONT-END SYSTEMS WITH A SHARED BACK SWITCH

(71) Applicant: Skyworks Solutions, Inc., Irvine, CA (US)

(72) Inventors: Mackenzie Brian Cook, Kanata (CA); John Jackson Nisbet, Ottawa (CA)

(73) Assignee: Skyworks Solutions, Inc., Irvine, CA (US)

( * ) Notice: Subject to any disclaimer, the term of this patent is extended or adjusted under 35 U.S.C. 154(b) by 78 days.

This patent is subject to a terminal disclaimer.

(21) Appl. No.: 16/947,587

(22) Filed: Aug. 7, 2020

(65) Prior Publication Data

US 2021/0075447 A1 Mar. 11, 2021

Related U.S. Application Data

(63) Continuation of application No. 16/506,227, filed on Jul. 9, 2019, now Pat. No. 10,742,241, which is a
(Continued)

(51) Int. Cl.
*H04B 1/18* (2006.01)
*H04B 1/38* (2015.01)
(Continued)

(52) U.S. Cl.
CPC ............ *H04B 1/006* (2013.01); *H03F 3/19* (2013.01); *H03F 3/245* (2013.01); *H03F 3/72* (2013.01);
(Continued)

(58) Field of Classification Search
CPC .......... H04B 1/005; H04B 1/006; H04B 1/38; H04B 1/40; H04B 1/44; H03H 9/70; H03H 9/72
See application file for complete search history.

(56) References Cited

U.S. PATENT DOCUMENTS

| 5,848,127 A | 12/1998 | Levitan et al. |
| 6,278,864 B1 | 8/2001 | Cummins et al. |

(Continued)

OTHER PUBLICATIONS

Skyworks Solutions, Inc. Data Sheet, SKY85202-11: 2.4 GHz, 802.11ac Switch/Low-Noise Amplifier Front-End, Jun. 9, 2014, 11 pages.

*Primary Examiner* — Samuel S Outten
*Assistant Examiner* — Alan Wong
(74) *Attorney, Agent, or Firm* — Knobbe, Martens, Olson & Bear, LLP

(57) ABSTRACT

Apparatus and methods for front-end systems with directional couplers and a shared back switch are provided. In certain configurations, a method includes transmitting a first transmit signal from a first transmit port to an antenna port, generating a first coupled signal in response to the first transmit signal using a first directional coupler, providing the first coupled signal to a receive port by way of a first loopback selection switch and a shared back switch, transmitting a second transmit signal from a second transmit port to the antenna port, generating a second coupled signal in response to the second transmit signal using a second directional coupler, and providing the second coupled signal to the receive port by way of a second loopback selection switch and the shared back switch.

20 Claims, 21 Drawing Sheets

Related U.S. Application Data continuation of application No. 15/834,430, filed on Dec. 7, 2017, now Pat. No. 10,396,830.

(60) Provisional application No. 62/433,384, filed on Dec. 13, 2016.

(51) Int. Cl.
*H04B 1/00* (2006.01)
*H04B 1/403* (2015.01)
*H03F 3/24* (2006.01)
*H03F 3/19* (2006.01)
*H03F 3/72* (2006.01)

(52) U.S. Cl.
CPC ............ *H04B 1/0057* (2013.01); *H04B 1/18* (2013.01); *H04B 1/38* (2013.01); *H04B 1/406* (2013.01); *H03F 2200/294* (2013.01); *H03F 2200/451* (2013.01); *H03F 2203/7239* (2013.01)

(56) References Cited

U.S. PATENT DOCUMENTS

| | | | |
|---|---|---|---|
| 6,356,536 | B1 | 3/2002 | Repke |
| 7,589,602 | B2 | 9/2009 | Poveda et al. |
| 7,633,435 | B2 * | 12/2009 | Meharry ............... G01S 7/038 342/198 |
| 7,675,359 | B2 | 3/2010 | Vice |
| 7,847,655 | B2 | 12/2010 | Otani et al. |
| 7,856,048 | B1 * | 12/2010 | Smaini ................. H04B 1/30 455/115.2 |
| 8,396,416 | B2 | 3/2013 | Kenington |
| 8,606,193 | B2 * | 12/2013 | Ko .................... H03D 7/168 455/39 |
| 8,729,949 | B2 | 5/2014 | Nisbet et al. |
| 8,908,746 | B2 | 12/2014 | Muhammad et al. |
| 9,219,467 | B2 * | 12/2015 | Inoue .................... H03H 9/706 |
| 9,325,042 | B2 | 4/2016 | Taniuchi et al. |
| 9,693,250 | B1 * | 6/2017 | Hou ...................... H04L 27/22 |
| 10,003,366 | B2 | 6/2018 | Dimpflmaier et al. |
| 10,211,860 | B2 | 2/2019 | Cook |
| 10,348,340 | B2 | 7/2019 | Cook |
| 10,396,830 | B2 * | 8/2019 | Cook ..................... H03F 3/72 |
| 10,461,785 | B2 | 10/2019 | Cook |
| 10,742,241 | B2 * | 8/2020 | Cook .................... H03F 3/245 |
| 2015/0038092 | A1 | 2/2015 | Andrys et al. |
| 2015/0222318 | A1 | 8/2015 | Jerng et al. |
| 2017/0018607 | A1 | 1/2017 | Mcpartlin et al. |
| 2017/0279416 | A1 | 9/2017 | Maxim et al. |

* cited by examiner

FRONT-END SYSTEMS WITH A SHARED BACK SWITCH

CROSS-REFERENCE TO RELATED APPLICATIONS

This application is a continuation of U.S. application Ser. No. 16/506,227, filed Jul. 9, 2019 and titled "FRONT-END SYSTEMS WITH MULTIPLE LOOPBACKS AND A SHARED BACK SWITCH," which is a continuation of U.S. application Ser. No. 15/834,430, filed Dec. 7, 2017 and titled "FRONT-END SYSTEMS WITH MULTIPLE LOOPBACKS AND A SHARED BACK SWITCH," which claims the benefit of priority under 35 U.S.C. § 119 of U.S. Provisional Patent Application No. 62/433,384, filed Dec. 13, 2016 and titled "FRONT-END SYSTEMS WITH MULTIPLE LOOPBACKS AND A SHARED BACK SWITCH," each of which is herein incorporated by reference in its entireties.

BACKGROUND

Technical Field

Embodiments of the invention relate to electronic systems, and in particular, to radio frequency (RF) electronics.

Description of the Related Technology

A radio frequency (RF) communication device can include a front-end system for processing signals communicated between a transceiver and an antenna of the RF system. A front-end system can provide a variety of functionalities, such as amplifying signals for transmission, amplifying received signals, filtering signals, switching or selection of signals, duplexing of signals, or multiplexing of signals (for instance, diplexing or triplexing).

Examples of RF electronics with one or more front-end systems include, but are not limited to, mobile phones, tablets, base stations, network access points, customer-premises equipment (CPE), laptops, and wearable electronics.

SUMMARY

In certain embodiments, the present disclosure relates to a front-end system. The front-end system includes an antenna port, a first transmit port configured to receive a first transmit signal and electrically connected to the antenna port via a first transmit path, a second transmit port configured to receive a second transmit signal and electrically connected to the antenna port via a second transmit path, a receive port, and a shared back switch common to a plurality of loopback paths of the front-end system, including a first loopback path from the first transmit port to the receive port, and a second loopback path from the second transmit port to the receive port.

In a number of embodiments, the front-end system further includes a shared termination circuit common to the plurality of loopback paths.

In various embodiments, the shared termination circuit includes a termination resistor and a termination capacitor electrically connected in series between a terminal of the shared back switch and ground.

In some embodiments, the shared back switch is common to at least three loopback paths.

In several embodiments, the first loopback path includes a first loopback impedance and a first loopback selection switch, and the second loopback path includes a second loopback impedance and a second loopback selection switch.

According to a number of embodiments, the front-end system further includes a control circuit configured to control the shared back switch, the first loopback selection switch, and the second loopback selection switch. In accordance with some embodiments, the control circuit is configured to control the first loopback selection switch with a first control signal, to control the second loopback selection switch with a second control signal, and to control the shared back switch with a third control signal that is based on a logical OR of the first control signal and the second control signal.

In some embodiments, the first loopback impedance and the second loopback impedance have different impedance values such that the first loopback path and the second loopback path provide different amounts of isolation to the receive port.

In accordance with several embodiments, the first loopback impedance is a resistor.

In a number of embodiments, the first loopback impedance is a reactive loopback impedance. In various embodiments, the reactive loopback impedance includes a capacitor. In accordance with several embodiments, the reactive loopback impedance includes two or more capacitors electrically connected in series. According to several embodiments, the reactive loopback impedance includes two or more capacitor arrays electrically connected in series. In accordance with various embodiments, the reactive loopback impedance includes an inductor. According to some embodiments, the first loopback path does not include any explicit resistors. In accordance with certain embodiments, the loopback circuit has an impedance angle of at least 10 degrees at a frequency of interest.

In some embodiments, the first loopback path includes a first directional coupler and a first selection switch, and the second loopback path includes a second directional coupler and a second selection switch.

In various embodiments, the front-end system further includes a low noise amplifier electrically connected between the antenna port and the receive port in a receive path.

In several embodiments, the first transmit signal corresponds to a cellular transmit signal and the second transmit signal corresponds to a Bluetooth signal.

In a number of embodiments, the front-end system further includes a third transmit port configured to receive a third transmit signal and electrically connected to the antenna port via a third transmit path, and the plurality of loopback paths further includes a third loopback path from the third transmit port to the receive port.

In certain embodiments herein, a method of providing multiple loopback in a front-end system is provided. The method includes receiving a first transmit signal at a first transmit port that is electrically coupled to an antenna port via a first transmit path, receiving a second transmit signal at a second transmit port that is electrically coupled to the antenna port via a second transmit path, and providing a plurality of transmit loopbacks to a receive port via a shared back switch. The plurality of transmit loopbacks include a first transmit loopback including path from the first transmit port to the receive port, and a second transmit loopback from the second transmit port to the receive port.

In various embodiments, the method further includes terminating the plurality of transmit loopbacks using a shared termination circuit.

In certain embodiments herein, a packaged module is provided. The packaged module includes a package substrate and a semiconductor die attached to the package substrate. The semiconductor die includes an antenna pin, a first transmit pin configured to receive a first transmit signal and electrically connected to the antenna pin via a first transmit path, a second transmit pin configured to receive a second transmit signal and electrically connected to the antenna pin via a second transmit path, a receive pin, and a shared back switch common to a plurality of loopback paths of the semiconductor die. The plurality of loopback paths include a first loopback path from the first transmit pin to the receive pin, and a second loopback path from the second transmit pin to the receive pin.

In a number of embodiments, a circuit layout of the shared back switch is positioned within about 200 μm of the receive pin.

In several embodiments, the semiconductor die further includes a shared termination circuit common to the plurality of loopback paths. In accordance with various embodiments, a circuit layout of the shared termination circuit is positioned within about 200 μm of the receive pin. In accordance with some embodiments, the shared termination circuit includes a termination resistor and a termination capacitor electrically connected in series between a terminal of the shared back switch and ground.

According to a number of embodiments, the shared back switch is common to at least three loopback paths.

In some embodiments, the first loopback path includes a first loopback impedance and a first loopback selection switch, and the second loopback path includes a second loopback impedance and a second loopback selection switch.

In a number of embodiments, the semiconductor die further includes a control circuit configured to control the shared back switch, the first loopback selection switch, and the second loopback selection switch.

In various embodiments, the control circuit is configured to control the first loopback selection switch with a first control signal, to control the second loopback selection switch with a second control signal, and to control the shared back switch with a third control signal that is based on a logical OR of the first control signal and the second control signal.

In several embodiments, the first loopback impedance and the second loopback impedance have different impedance values such that the first loopback path and the second loopback path provide different amounts of isolation.

In some embodiments, the first loopback impedance is a resistor.

In a number of embodiments, the first loopback impedance is a reactive loopback impedance. In accordance with several embodiments, the reactive loopback impedance includes a capacitor. According to various embodiments, the reactive loopback impedance includes two or more capacitors electrically connected in series. In accordance with some embodiments, the reactive loopback impedance includes two or more capacitor arrays electrically connected in series. In several embodiments, the reactive loopback impedance includes an inductor. According to certain embodiments, the first loopback path does not include any explicit resistors.

In several embodiments, the first loopback path has an impedance angle of at least 10 degrees at a frequency of interest.

In some embodiments, the semiconductor die further includes a low noise amplifier electrically connected between the antenna pin and the receive pin in a receive path.

In accordance with a number of embodiments, the first transmit signal corresponds to a cellular transmit signal and the second transmit signal corresponds to a Bluetooth signal.

In several embodiments, the first loopback path includes a first directional coupler and a first selection switch, and the second loopback path includes a second directional coupler and a second selection switch.

In various embodiments, the semiconductor die further includes a third transmit pin configured to receive a third transmit signal and electrically connected to the antenna pin via a third transmit path, and the plurality of loopback paths further include a third loopback path from the third transmit pin to the receive pin.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1A:
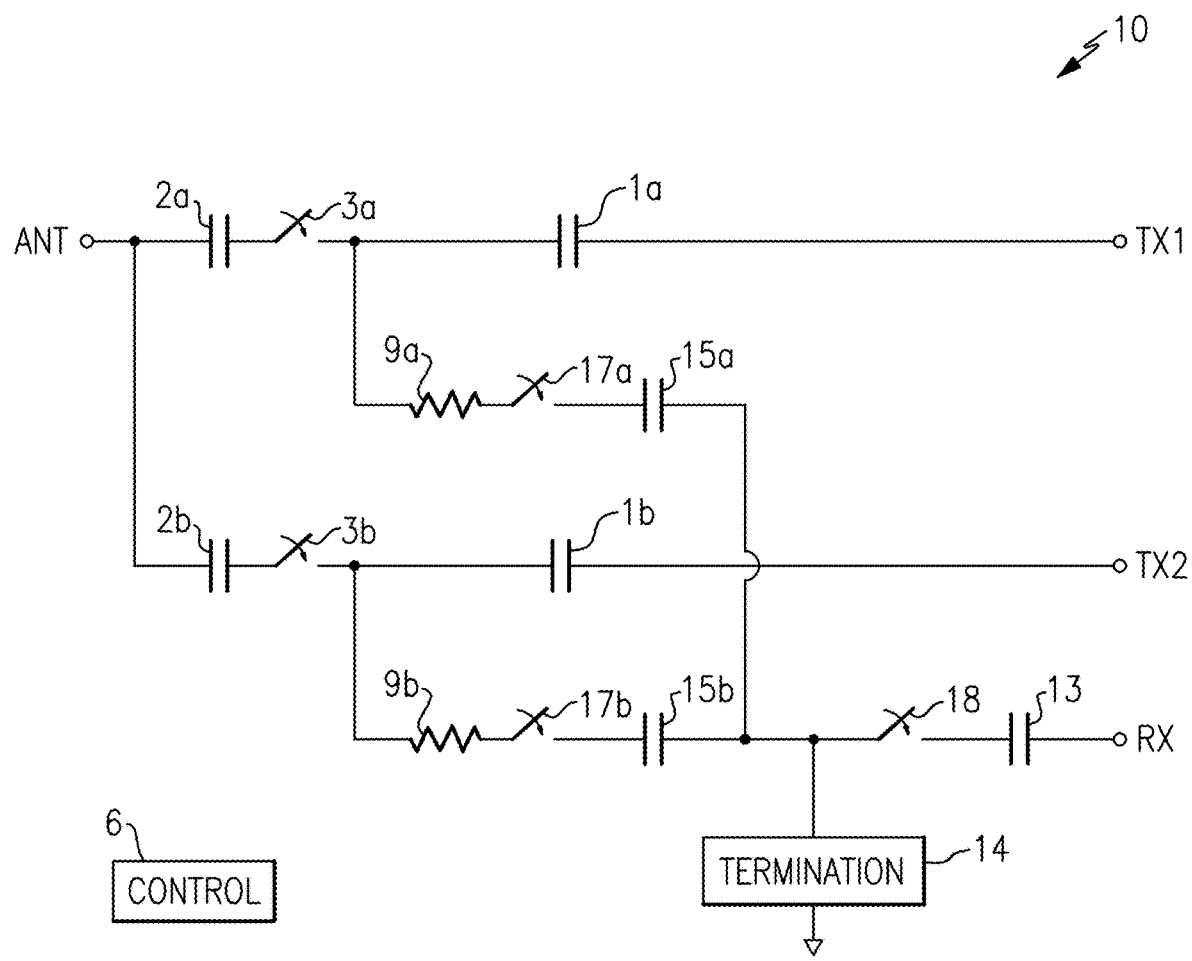
FIG. 1A is a schematic diagram of one embodiment of a front-end system with multiple loopbacks and a shared back switch.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Examples of Front-End Systems with a Shared Back Switch

A front-end system can be used to control access of transmit and receive circuitry to an antenna. For example, the front-end system can include transmit and receive ports for handling radio frequency signals, including, but not limited to, wireless local area network (WLAN) signals, Bluetooth signals, and/or cellular signals. Additionally, the front-end system can include an antenna port and switches used to connect a particular transmit and/or receive port to the antenna port. To enhance integration, a front-end system can include a low noise amplifier (LNA), a power amplifier, and/or other circuitry integrated with the switches. Front-end systems can be used in a wide variety of applications, including, but not limited to, smartphones, base stations, handsets, and/or tablets.

In certain applications, it is desirable to provide loopback from a particular transmit port to a receive port, thereby providing a portion of a desired transmit signal to the receive port. Implementing a front-end system with loopback can provide a number of benefits. For instance, loopback can be used when calibrating a transceiver for misalignments or impairments, for performing digital pre-distortion (DPD), and/or for a variety of other purposes.

In certain applications, it is desirable for a front-end system to include multiple loopbacks.

For example, a front-end system can include multiple transmit ports, and in can be desirable for loopback to be provided for two more of the transmit ports. In such applications, the amount of desired isolation can vary for each loopback. In one specific example, a front-end system includes a cellular transmit port with a desired 37 dB isolation to a receive port, a high power Bluetooth port with a desired 32 dB isolation to the receive port, and a low power Bluetooth port with a desired 25 dB isolation to the receive port.

Including multiple loopbacks in a front-end system can increase the area and/or complexity of the front-end system. For example, circuitry for each loopback, such as capacitors, can occupy a substantial amount of chip area. Moreover, by providing multiple loopbacks to a common receive port, layout resources near the receive port can be constrained.

Apparatus and methods for front-end systems with multiple loopbacks and a shared back switch are provided. In certain configurations, a front-end system includes a first transmit path between a first transmit port and an antenna port, a second transmit path between a second transmit port and the antenna port, a first loopback path from the first transmit path to a receive port, and a second loopback path from the second transmit path to the receive port. The first and second loopback paths operate with a shared back switch to reduce area and/or complexity of the front-end system. Additionally, each loopback path includes a loopback selection switch that operates in combination with the back switch to select that particular loopback path. In certain implementations, the front-end system includes one or more additional transmit paths and corresponding loopback paths that are connected to the receive port via the shared back switch.

Using a shared back switch can provide a number of advantages. For example, using a shared back switch can reduce a number of termination circuits associated with the loopbacks. Since a termination circuit can include a relatively large termination capacitor for grounding a termination resistor to provide appropriate termination (for instance, 50Ω), reducing a number of termination circuits can reduce chip area. Moreover, it is desirable for such termination capacitors to be positioned relatively close in distance to the receive port, for instance, within about 200 μm, thereby avoiding performance degradation arising from long signal routes and corresponding parasitics. Thus, eliminating termination capacitors can alleviate layout constraints in proximity to the receive port.

Accordingly, by utilizing a common back switch and a shared termination circuit across multiple loopback arms or paths, die area is reduced and layout constraints are relaxed.

FIG. 1A is a schematic diagram of one embodiment of a front-end system 10 with multiple loopbacks and a shared back switch. The front-end system 10 includes an antenna port ANT, a first transmit port TX1, a second transmit port TX2, a receive port RX, a first transmit port DC blocking capacitor 1a, a second transmit port DC blocking capacitor 1b, a first antenna port DC blocking capacitor 2a, a second antenna port DC blocking capacitor 2b, a first antenna switch 3a, a second antenna switch 3b, a control circuit 6, a first loopback resistor 9a, a second loopback resistor 9b, a receive port DC blocking capacitor 13, a termination circuit 14, a first loopback DC blocking capacitor 15a, a second loopback DC blocking capacitor 15b, a first loopback selection switch 17a, a second loopback selection switch 17b, and a shared back switch 18.

Although one embodiment of a front-end system with multiple loopbacks and a shared back switch is shown in FIG. 1A, the teachings herein are applicable to front-end systems implemented in a wide variety of ways.

For example, a front-end system with multiple loopbacks and a shared back switch can include additional ports, paths, switches, and/or other circuitry, including, for instance, LNAs and/or power amplifiers. Moreover, the teachings herein are applicable to configurations using a different arrangement of components, such as different implementations of switching, DC blocking, and/or termination. Accordingly, other configurations are possible.

As shown in FIG. 1A, the first transmit port DC blocking capacitor 1a, the first antenna switch 3a, and the first antenna port DC blocking capacitor 2a are electrically connected in series along a first transmit path between the first transmit port TX1 and the antenna port ANT. Additionally, the second transmit port DC blocking capacitor 1b, the second antenna switch 3b, and the second antenna port DC blocking capacitor 2b are electrically connected in series along a second transmit path between the second transmit port TX2 and the antenna port ANT.

The first loopback resistor 9a, the first loopback selection switch 17a, the first loopback DC blocking capacitor 15a, the shared back switch 18, and the receive port DC blocking capacitor 13 are electrically connected in series along a first loopback path from the first transmit port TX1 to the receive port RX. Additionally, the second loopback resistor 9b, the second loopback selection switch 17b, the second loopback DC blocking capacitor 15b, the shared back switch 18, and the receive port DC blocking capacitor 13 are electrically connected in series along a second loopback path from the second transmit port TX2 to the receive port RX.

The first transmit port TX1 and the second transmit port TX2 can be used for transmission of signals of a wide variety of frequencies and/or signal types. For example, each of the transmit ports can operate at different frequencies and/or can receive transmit signals of different protocols. The impedances of the first and second loopback paths, such as the resistances of the first loopback resistor 9a and the second loopback resistor 9b, can be implemented to achieve a desired isolation, which can be different for each loopback path. Although an implementation with resistive loopback impedance is shown, reactive loopback impedance can also be used.

Moreover, the teachings herein are applicable to implementations in which one or more of the loopback resistors 9a and 9b are omitted in favor of including directional couplers. Accordingly, in certain embodiments, multiple directional couplers can operate using a shared back switch.

As shown in FIG. 1A, the termination circuit 14 is shared amongst the loopback paths, and operates in shunt thereto. In the illustrated embodiment, the termination circuit 14 is connected between ground and an end or terminal of the shared back switch 18.

The termination circuit 14 aids in terminating the receive port RX when the shared back switch 18 is activated. Thus, the termination circuit 14 can enhance matching of the receive port RX. Although one example placement of a termination circuit is shown, termination can be provided in other ways. In another embodiment, a termination circuit is omitted.

The control circuit 6 controls the mode of the front-end system 10, such as by opening or closing the illustrated switches. For example, the first and second antenna switches 3a and 3b can be turned on to select the first and second transmit paths, respectively. Additionally, the first loopback selection switch 17a and the shared back switch 18 can be turned on to select the first loopback path, and the second loopback selection switch 17b and the shared back switch 18 can be turned on to select the second loopback path. By controlling the state of the switches, the control circuit 6 can activate the desired path(s) of the front-end system 10.

Although one example of switching is shown, other implementations of switches are possible, including, but not limited to, other switch placements and/or other numbers of switches. For clarity of the figures, control signals from the control circuit 6 for opening or closing the switches are not illustrated.

Using the shared back switch 18 and the shared termination circuit 14 across multiple loopback paths reduces die area and layout constraints near the receive port RX.

For example, a termination circuit for a loopback path can include a termination resistor and a relatively large termination capacitor for grounding the termination resistor at the frequency of interest. By using the shared termination circuit 14, a number of termination capacitors can be reduced. Moreover, since it is desirable for such termination capacitors to be positioned relatively close in distance to the receive port to avoid degradation in termination arising from long conductive routes, eliminating termination capacitors can alleviate layout constraints in proximity to the receive port RX.

Additional details of the front-end system 10 can be as described earlier.

Figure 1B:
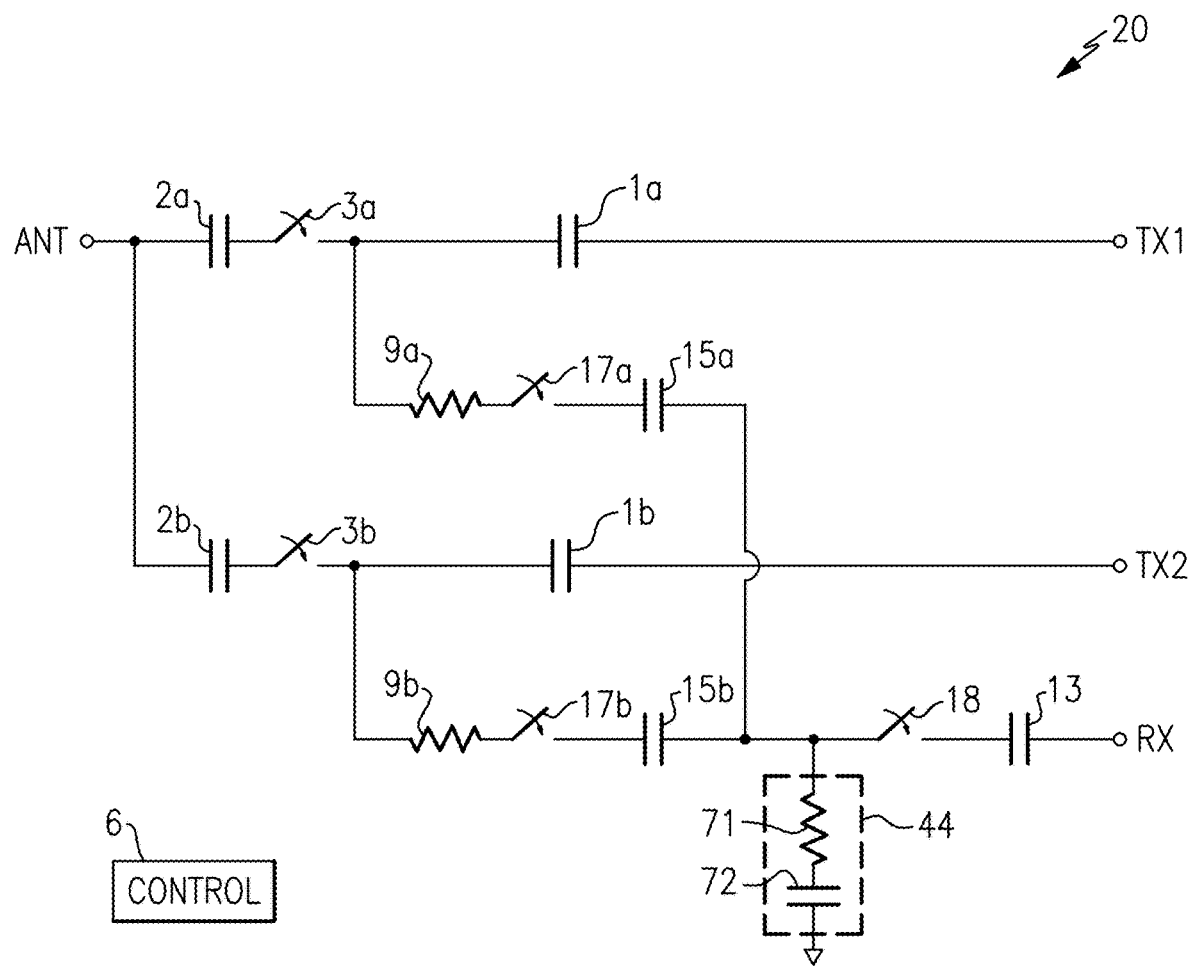
FIG. 1B is a schematic diagram of another embodiment of a front-end system with multiple loopbacks and a shared back switch.

FIG. 1B is a schematic diagram of another embodiment of a front-end system 20 with multiple loopbacks and a shared back switch. The front-end system 20 includes an antenna port ANT, a first transmit port TX1, a second transmit port TX2, a receive port RX, a first transmit port DC blocking capacitor 1a, a second transmit port DC blocking capacitor 1b, a first antenna port DC blocking capacitor 2a, a second antenna port DC blocking capacitor 2b, a first antenna switch 3a, a second antenna switch 3b, a control circuit 6, a first loopback resistor 9a, a second loopback resistor 9b, a receive port DC blocking capacitor 13, a termination circuit 44, a first loopback DC blocking capacitor 15a, a second loopback DC blocking capacitor 15b, a first loopback selection switch 17a, a second loopback selection switch 17b, and a shared back switch 18.

The front-end system 20 of FIG. 1B is similar to front-end system 10 of FIG. 1A, except that the front-end system 20 of FIG. 1B illustrates a specific termination circuit implementation.

In particular, the termination circuit 44 includes a termination resistor 71 and a termination capacitor 72 electrically connected in series between a common node to the loopback paths and ground. In certain embodiments, the termination resistor 71 provides a desired termination impedance (for instance, about 50 Ohm), and the termination capacitor 72 can be sufficiently large (for instance, at least 10 pF) to provide low impedance at the frequency of interest such that the termination resistor 71 provides the proper amount of termination impedance.

When the shared back switch 18 is turned on, the termination circuit 44 operates to provide termination to the receive port RX. In one example, the front-end system 20 operates in a 50Ω signaling environment, and the termination resistor 71 is selected to be about 50Ω. To provide proper termination at the frequencies of interest, the termination capacitor 72 and the receive port DC blocking capacitor 13 can be relatively large. For instance, in one specific example, the termination capacitor 72 is selected to be about 12 pF and the receive port DC blocking capacitor 13 is selected to be about 6 pF.

By sharing the back switch 18 and the termination circuit 44 amongst multiple loopbacks, die area and/or layout constraints are reduced.

Additional details of the front-end system 20 can be as described earlier.

Figure 1C:
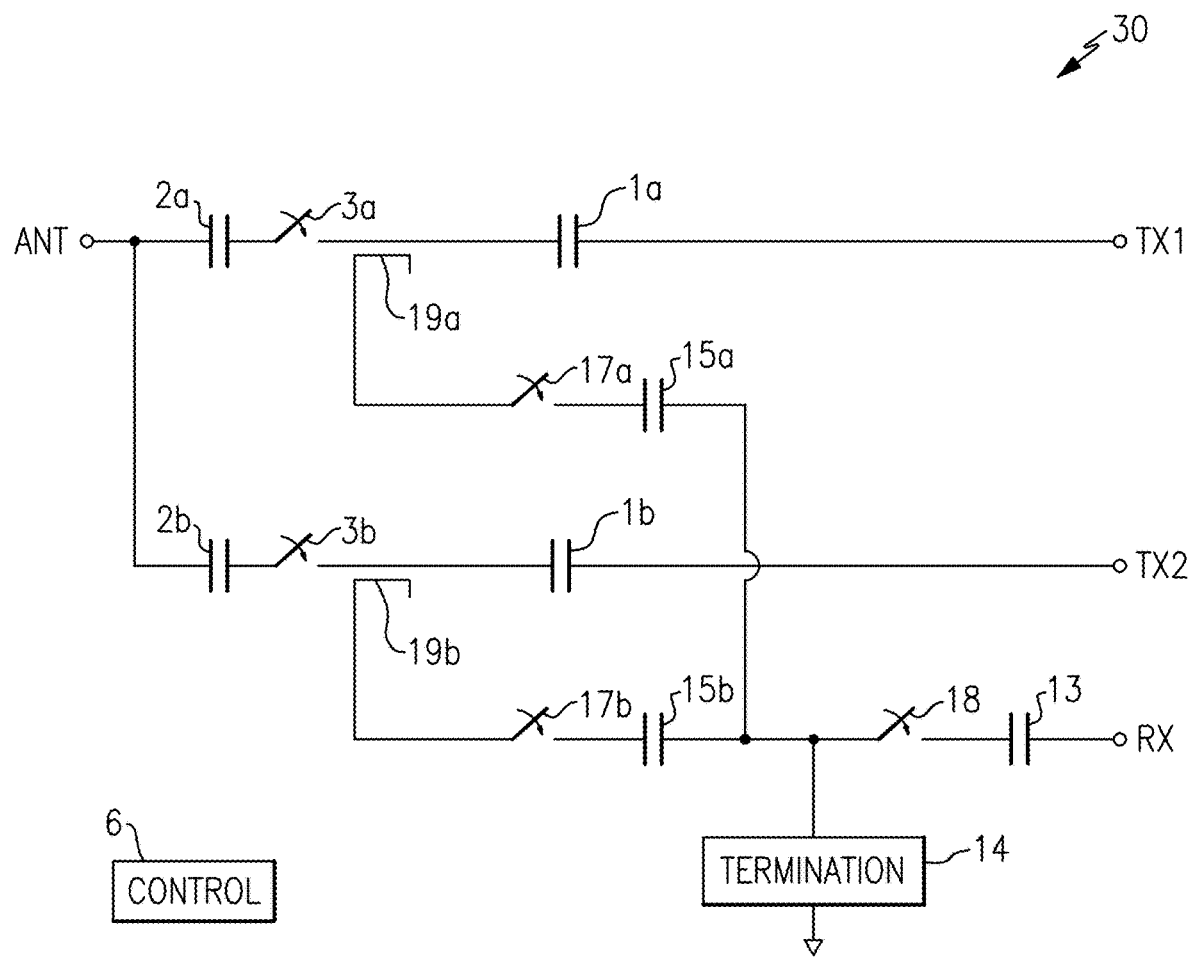
FIG. 1C is a schematic diagram of another embodiment of a front-end system with multiple loopbacks and a shared back switch.

FIG. 1C is a schematic diagram of another embodiment of a front-end system 30 with multiple loopbacks and a shared back switch. The front-end system 30 includes an antenna port ANT, a first transmit port TX1, a second transmit port TX2, a receive port RX, a first transmit port DC blocking capacitor 1a, a second transmit port DC blocking capacitor 1b, a first antenna port DC blocking capacitor 2a, a second antenna port DC blocking capacitor 2b, a first antenna switch 3a, a second antenna switch 3b, a control circuit 6, a first directional coupler 19a, a second directional coupler 19b, a receive port DC blocking capacitor 13, a termination circuit 14, a first loopback DC blocking capacitor 15a, a second loopback DC blocking capacitor 15b, a first loopback selection switch 17a, a second loopback selection switch 17b, and a shared back switch 18.

The front-end system 30 of FIG. 1C is similar to the front-end system 10 of FIG. 1A, except that the front-end system 30 of FIG. 1C omits the first loopback resistor 9a and the second loopback resistor 9b in favor of including the first directional coupler 19a and the second directional coupler 19b, respectively.

Figure 2:
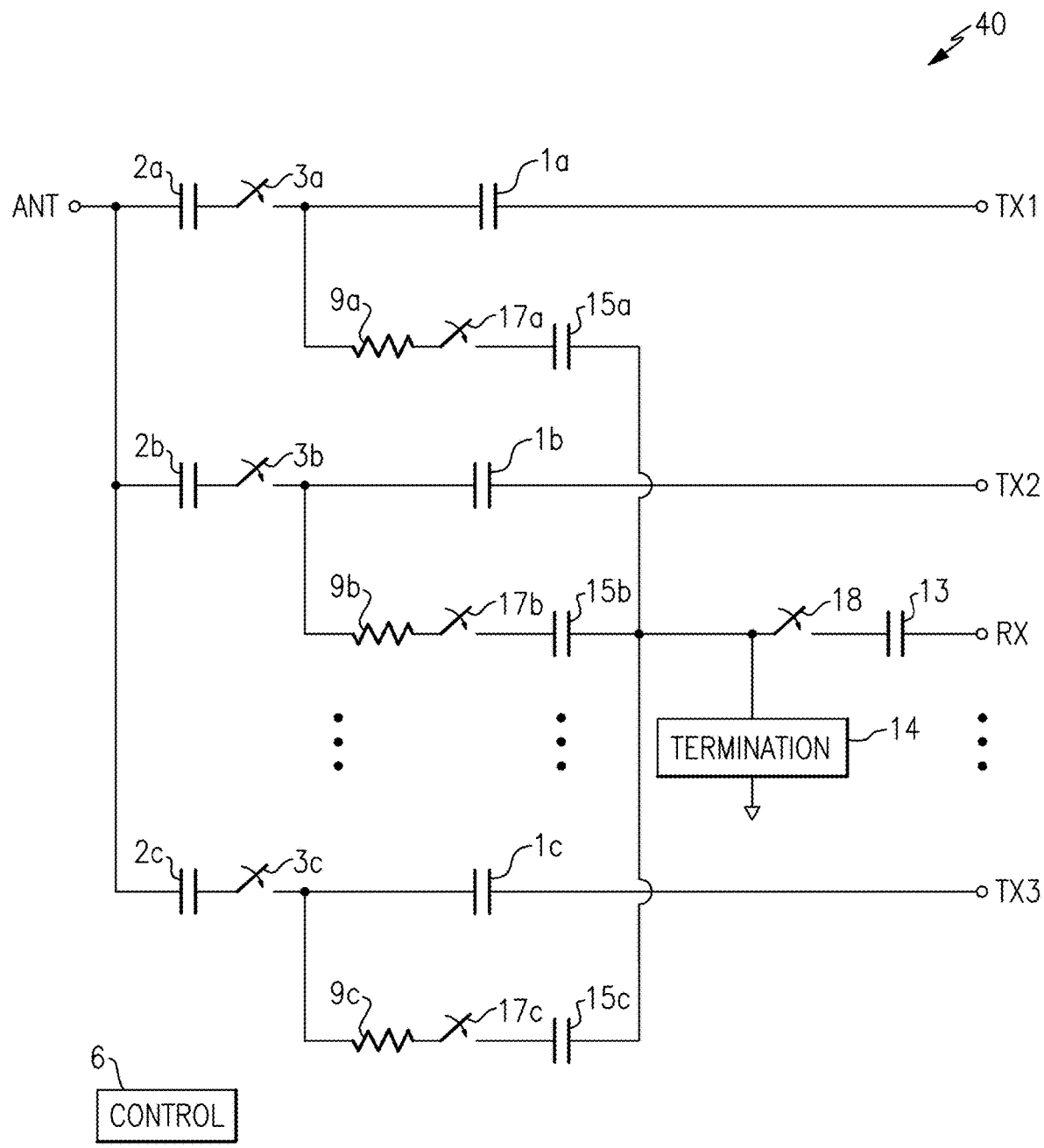
FIG. 2 is a schematic diagram of another embodiment of a front-end system with multiple loopbacks and a shared back switch.

FIG. 2 is a schematic diagram of another embodiment of a front-end system 40 with multiple loopbacks and a shared back switch. The front-end system 40 includes an antenna port ANT, a first transmit port TX1, a second transmit port TX2, a third transmit port TX3, a receive port RX, a first transmit port DC blocking capacitor 1a, a second transmit port DC blocking capacitor 1b, a third transmit port DC blocking capacitor 1c, a first antenna port DC blocking capacitor 2a, a second antenna port DC blocking capacitor 2b, a third antenna port DC blocking capacitor 2c, a first antenna switch 3a, a second antenna switch 3b, a third antenna switch 3c, a control circuit 6, a first loopback resistor 9a, a second loopback resistor 9b, a third loopback resistor 9c, a receive port DC blocking capacitor 13, a termination circuit 14, a first loopback DC blocking capacitor 15a, a second loopback DC blocking capacitor 15b, a third loopback blocking capacitor 15c, a first loopback selection switch 17a, a second loopback selection switch 17b, a third loopback selection switch 17c, and a shared back switch 18.

The front-end system 40 of FIG. 2 is similar to front-end system 10 of FIG. 1A, except that the front-end system 40 of FIG. 2 includes an additional or third transmit path and a corresponding loopback path that is connected to the receive port RX via the shared back switch 18.

As shown in FIG. 2, the third transmit port DC blocking capacitor 1c, the third antenna switch 3c, and the third antenna port DC blocking capacitor 2c are electrically connected in series along a third transmit path between the third transmit port TX3 and the antenna port ANT. Additionally, the third loopback resistor 9c, the third loopback selection switch 17c, the third loopback DC blocking capacitor 15c, the shared back switch 18, and the receive port DC blocking capacitor 13 are electrically connected in series along a third loopback path from the third transmit port TX3 to the receive port RX.

Accordingly, the illustrated front-end system 40 includes three loopback paths that share the back switch 18. Although an example with three loopback paths is shown, a back switch can be shared amongst more or fewer loopback paths. In another example, four or more loopback paths share a back switch.

Additionally, the control circuit 6 can control the shared back switch 18 and the loopback selection switches 17a-17c to select a particular loopback path. For example, to select the first loopback path, the control circuit 6 can turn on the shared back switch 18 and the first loopback selection switch 17a and turn off the second and third loopback selection switches 17b, 17c. Additionally, to select the second loopback path, the control circuit 6 can turn on the shared back switch 18 and the second loopback selection switch 17b and turn off the first and third loopback selection switches 17a, 17c. Furthermore, to select the third loopback path, the control circuit 6 can turn on the shared back switch 18 and the third loopback selection switch 17c and turn off the first and second loopback selection switches 17a, 17b.

Thus, the control circuit 6 can selectively activate a particular loopback path by controlling the state of the switches.

The first transmit port TX1, the second transmit port TX2, and the third transmit port TX3 can correspond to signals of various frequency ranges and/or signal types. Additionally, the amount of isolation provided by each loopback path can be different. For example, the loopback impedance of a loopback path (for example, loopback resistors 9a-9c) can be implemented to achieve a desired amount of isolation. Accordingly, multiple loopbacks of different isolation, different operating frequency, and/or different signaling types can share a common back switch.

In one embodiment, the first transmit port TX1 is a cellular transmit port, the second transmit port TX2 is a high power Bluetooth port, and the third transmit port TX3 is a low power Bluetooth port.

Additional details of the front-end system 40 can be as described earlier.

Figure 3:
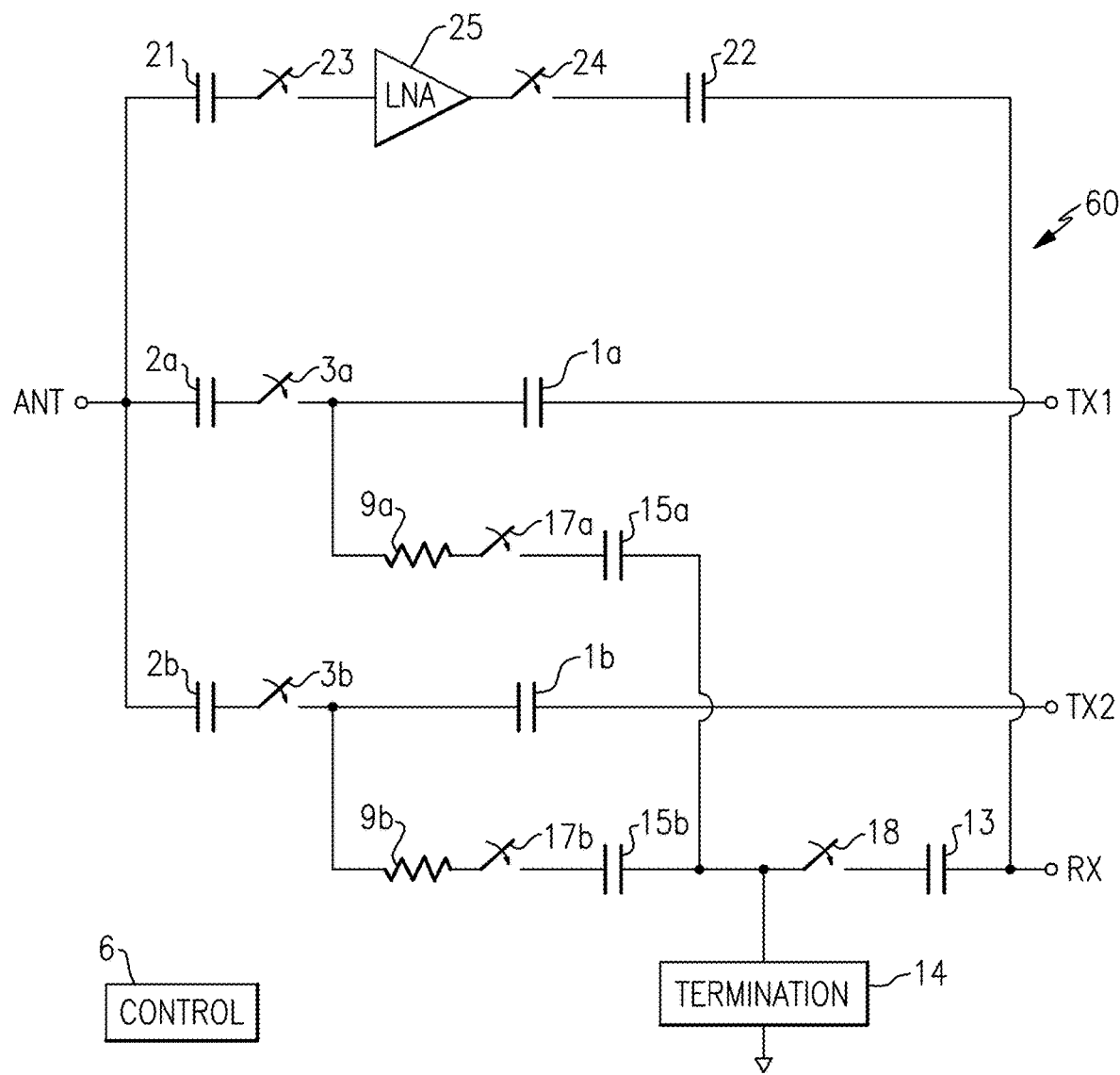
FIG. 3 is a schematic diagram of another embodiment of a front-end system with multiple loopbacks and a shared back switch.

FIG. 3 is a schematic diagram of another embodiment of a front-end system 60 with multiple loopbacks and a shared back switch. The front-end system 60 includes an antenna port ANT, a first transmit port TX1, a second transmit port TX2, a receive port RX, a first transmit port DC blocking capacitor 1a, a second transmit port DC blocking capacitor 1b, a first antenna port DC blocking capacitor 2a, a second antenna port DC blocking capacitor 2b, a first antenna switch 3a, a second antenna switch 3b, a control circuit 6, a first loopback resistor 9a, a second loopback resistor 9b, a receive port DC blocking capacitor 13, a termination circuit 14, a first loopback DC blocking capacitor 15a, a second loopback DC blocking capacitor 15b, a first loopback selection switch 17a, a second loopback selection switch 17b, a shared back switch 18, an LNA input DC blocking capacitor 21, an LNA output DC blocking capacitor 22, an LNA input switch 23, an LNA output switch 24, and an LNA 25.

The front-end system 60 of FIG. 3 is similar to the front-end system 10 of FIG. 1A, except that the front-end system 60 further includes a receive path from the antenna port ANT to the receive port RX via the LNA 25. The front-end systems herein can include a wide variety of ports, switches, paths, and circuitry. Although one specific implementation of an LNA receive path is shown in FIG. 3, other implementations are possible.

Additional details of the front-end system 60 can be as described earlier.

Figure 4:
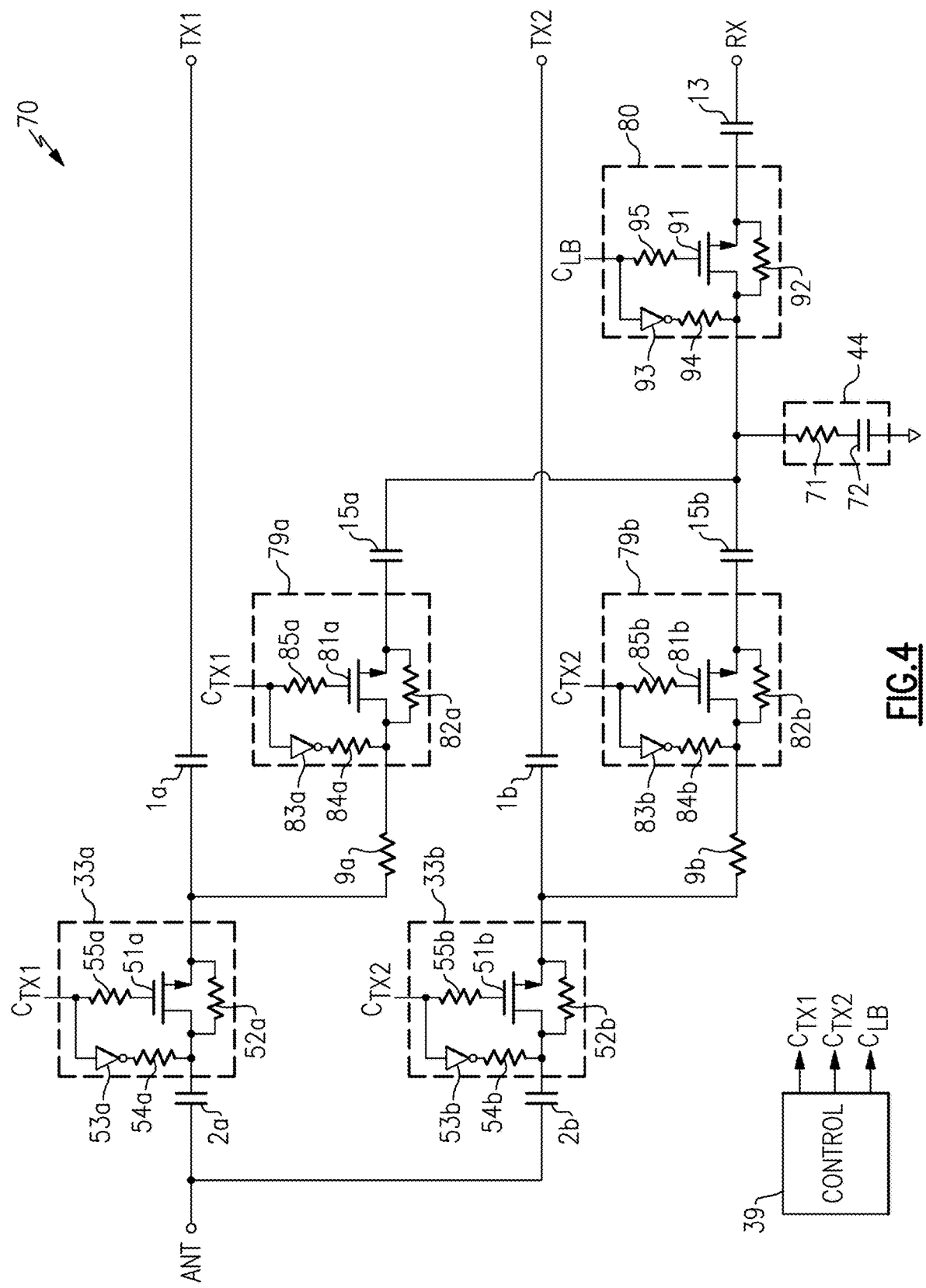
FIG. 4 is a schematic diagram of another embodiment of a front-end system with multiple loopbacks and a shared back switch.

FIG. 4 is a schematic diagram of another embodiment of a front-end system 70 with multiple loopbacks and a shared back switch. The front-end system 70 includes an antenna port ANT, a first transmit port TX1, a second transmit port TX2, a receive port RX, a first transmit port DC blocking capacitor 1a, a second transmit port DC blocking capacitor 1b, a first antenna port DC blocking capacitor 2a, a second antenna port DC blocking capacitor 2b, a first antenna switch 33a, a second antenna switch 33b, a control circuit 39, a first loopback resistor 9a, a second loopback resistor 9b, a receive port DC blocking capacitor 13, a termination circuit 44, a first loopback DC blocking capacitor 15a, a second loopback DC blocking capacitor 15b, a first loopback selection switch 79a, a second loopback selection switch 79b, and a shared back switch 80.

The front-end system 70 of FIG. 4 is similar to front-end system 10 of FIG. 1A, except that the front-end system 70 of FIG. 4 illustrates specific termination circuit and switch implementations.

The termination circuit 44 includes a termination resistor 71 and a termination capacitor 72 electrically connected in series. In certain embodiments, the termination resistor 71 provides a desired termination impedance (for instance, about 50 Ohm), and the termination capacitor 72 is sufficiently large (for instance, at least 10 pF) to provide low impedance at the frequency of interest such that the termination resistor 71 provides the proper amount of termination.

The illustrated first antenna switch 33a includes a FET 51a, a channel biasing resistor 52a, a biasing inverter 53a, an inverter output resistor 54a, and a gate resistor 55a. Furthermore, the illustrated second antenna switch 33b includes a FET 51b, a channel biasing resistor 52b, a biasing inverter 53b, an inverter output resistor 54b, and a gate resistor 55b. Additionally, the illustrated first loopback selection switch 79a includes a FET 81a, a channel biasing resistor 82a, a biasing inverter 83a, an inverter output resistor 84a, and a gate resistor 85a. Furthermore, the illustrated second loopback selection switch 79b includes a FET 81b, a channel biasing resistor 82b, a biasing inverter 83b, an inverter output resistor 84b, and a gate resistor 85b. Additionally, the shared back switch 80 includes a FET 91, a channel biasing resistor 92, a biasing inverter 93, an inverter output resistor 94, and a gate resistor 95.

Although specific switch implementations are shown, the teachings herein are applicable to switches implemented in a wide variety of ways. For example, other types of transistors can be used. Moreover, a switch can be implemented without transistors, for instance, a pin diode switch and/or a microelectromechanical switch.

In the illustrated embodiment, a first transmit selection control signal $C_{TX1}$ from the control circuit 39 controls the first antenna switch 33a and the first loopback selection switch 79a. Additionally, a second transmit selection control signal $C_{TX2}$ from the control circuit 39 controls the second antenna switch 33b and the second loopback selection switch 79b. Furthermore, a loopback control signal $C_{LB}$ controls the shared back switch 80. In certain implementations, the loopback control signal $C_{LB}$ is controlled based on a logical OR of the transmit selection control signals of the loopback paths. For instance, in an implementation with two loopback paths, the loopback control signal $C_{LB}$ can controlled be controlled based on the Boolean equation $C_{LB}=C_{TX1}+C_{TX2}$.

Additional details of the front-end system 70 can be as described earlier.

Examples of Front-End Systems with Reactive Loopback

Apparatus and methods for front-end systems with reactive loopback are provided. In certain configurations, a front-end system includes a transmit port that receives a transmit signal, an antenna port, a receive port, and an antenna switch connected along a transmit path between the transmit port and the antenna port. The front-end system further includes a loopback circuit including a reactive loopback impedance and a back switch electrically connected in series in a loopback path between the transmit port and the receive port. The loopback circuit provides a portion of the transmit signal to the receive port when the back switch is activated. Using reactive loopback impedance in the loopback circuit reduces an insertion loss of the transmit path relative to a configuration using resistive loopback impedance.

A front-end system can be switchable between multiple modes, including, for example, one or more transmit modes and one or more receives modes. Additionally, loopback can be provided for one or more modes of the front-end system.

A loopback circuit can be implemented to provide a particular amount of fixed isolation, corresponding to a desired proportion of a transmit signal to provide to the receive port. In certain applications, the desired amount of fixed isolation is relatively small, which results in a relatively strong tradeoff between the amount of isolation and the resulting insertion loss to the transmit path due to the presence of the loopback circuit.

A resistor can be provided between a pair of ports to achieve a desired loopback coupling factor between the ports. To decrease the amount of isolation provided by the loopback, the resistance of the loopback resistor can be decreased to allow a greater amount of signal to leak through.

However, resistance provides lossy impedance. For example, a current flowing through a resistor leads to resistive heating and a corresponding energy loss. Accordingly, using resistive loopback impedance can lead to an increase in insertion loss beyond a predicted insertion loss from three-port network theory.

In certain implementations herein, a loopback circuit includes a loopback impedance that is mostly reactive. In one embodiment, a total loopback impedance of a loopback circuit has an impedance angle of at least 10 degrees, or more particularly at least 20 degrees at a frequency of interest (for instance, a carrier frequency of the transmit signal). In one embodiment, the loopback path does not include any explicit resistors.

By using reactive loopback impedance that is ideally lossless, insertion loss of a front-end with loopback functionality can be significantly improved relative to an implementation using resistive loopback. The benefits of reactive loopback can be particularly beneficial for implementations in which the desired amount of isolation provided by the loopback circuit is relatively low, for instance, 25 dB or smaller.

The loopback circuits herein can be used for a variety of radio frequency signals, including, but not limited to, signals in the range of 30 kHz to 300 gigahertz (GHz), such as in the range of about 450 MHz to about 6 GHz for certain communications standards. In one specific example, a loopback circuit with reactive loopback impedance is used in a wireless local area network (WLAN) application associated with frequencies in the range of about 2.4 GHz to about 5 GHz.

Figure 5:
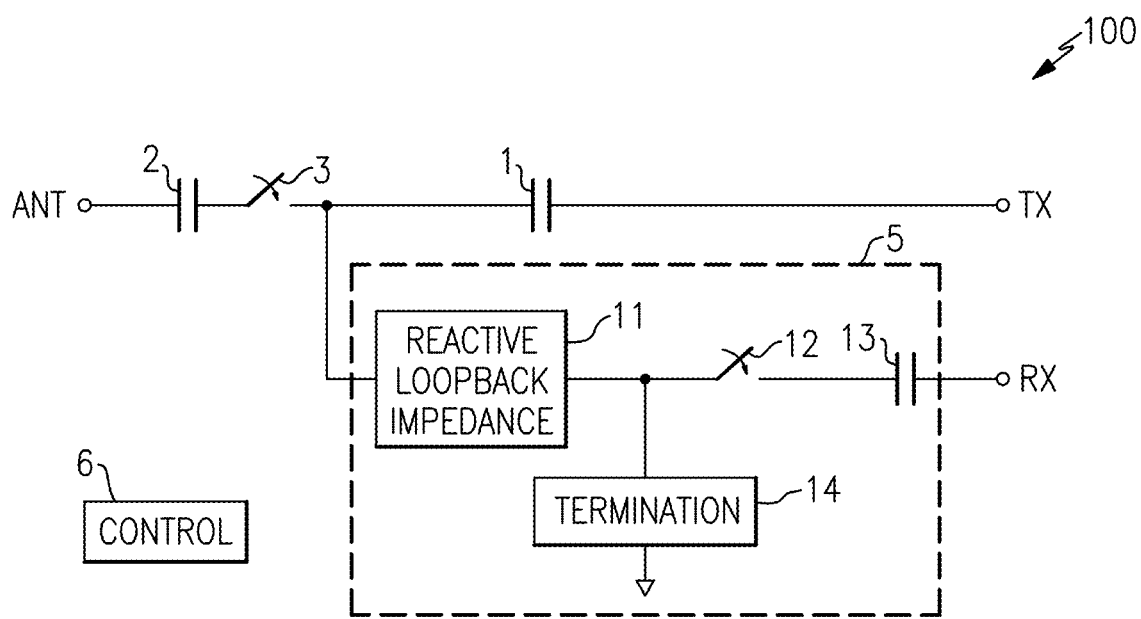
FIG. 5 is a schematic diagram of one embodiment of a front-end system with reactive loopback.

FIG. 5 is a schematic diagram of one embodiment of a front-end system 100 with reactive loopback. The front-end system 100 includes an antenna port ANT, a transmit port TX, a receive port RX, a transmit port DC blocking capacitor 1, an antenna port DC blocking capacitor 2, an antenna switch 3, a loopback circuit 5, and a control circuit 6. The loopback circuit 5 includes a reactive loopback impedance 11, a back switch 12, a receive port DC blocking capacitor 13, and a termination circuit 14.

Although one embodiment of a front-end system including reactive loopback is shown in FIG. 5, the teachings herein are applicable to front-end systems implemented in a wide variety of ways.

For example, a front-end system with reactive loopback can include additional ports, paths, switches, and/or other circuitry, including, for instance, LNAs and/or power amplifiers. Moreover, the teachings herein are applicable to configurations using a different arrangement of components, such as different implementations of switching, DC blocking, and/or termination. Accordingly, other configurations are possible.

As shown in FIG. 5, the transmit port DC blocking capacitor 1, the antenna switch 3, and the antenna port DC blocking capacitor 2 are electrically connected in series along a transmit path between the transmit port TX and the antenna port ANT. Additionally, the loopback circuit 5 is connected between a node of the transmit path and the receive port RX. As shown in FIG. 5, the loopback circuit 5 is in shunt with respect to the transmit path. When the back switch 12 is activated (thereby selecting or activating loopback), the loopback circuit 5 provides a portion of the transmit signal received on the transmit port TX to the receive port RX.

In the illustrated embodiment, the reactive loopback impedance 11, the back switch 12, and the receive port DC blocking capacitor 13 are electrically connected in series along a loopback path. Additionally, the termination circuit 14 is connected in shunt to the loopback path. As shown in FIG. 5, the termination circuit 14 is connected between ground and a node that is between the reactive loopback impedance 11 and the back switch 12.

The termination circuit 14 aids in terminating the receive port RX when the back switch 12 is activated. Thus, the termination circuit 14 can enhance matching of the receive port RX. Although one example placement of a termination circuit is shown, termination circuits can be implemented in other ways. In another embodiment, a termination circuit is omitted.

The control circuit 6 controls the mode of the front-end system 100 by opening or closing the antenna switch 3 and/or the back switch 12. For example, by controlling the state of the antenna switch 3, the transmit path between the antenna terminal ANT and the transmit terminal TX can be selectively activated. Additionally, by controlling the state of the back switch 12, loopback from the transmit path to the receive port RX can be selectively activated.

Although one example of switching is shown, other implementations of switches are possible, including, but not limited to, other switch placements and/or other numbers of switches. For clarity of the figures, control signals from the control circuit 6 for opening or closing the switches are not illustrated.

Although not shown in FIG. 5 for clarity of the figures, the front-end system 100 can include additional signal paths that are selectable via switches and/or other circuitry.

The illustrated loopback circuit 5 includes the reactive loopback impedance 11. By using the reactive loopback impedance 11, an insertion loss between the transmit port TX and the antenna port ANT can be reduced relative to an implementation using resistive loopback. For example, a current flowing through a resistor leads to resistive heating and corresponding energy loss. Accordingly, the illustrated embodiment exhibits superior insertion loss performance.

Additional details of the front-end system 100 can be as described earlier.

Figure 6:
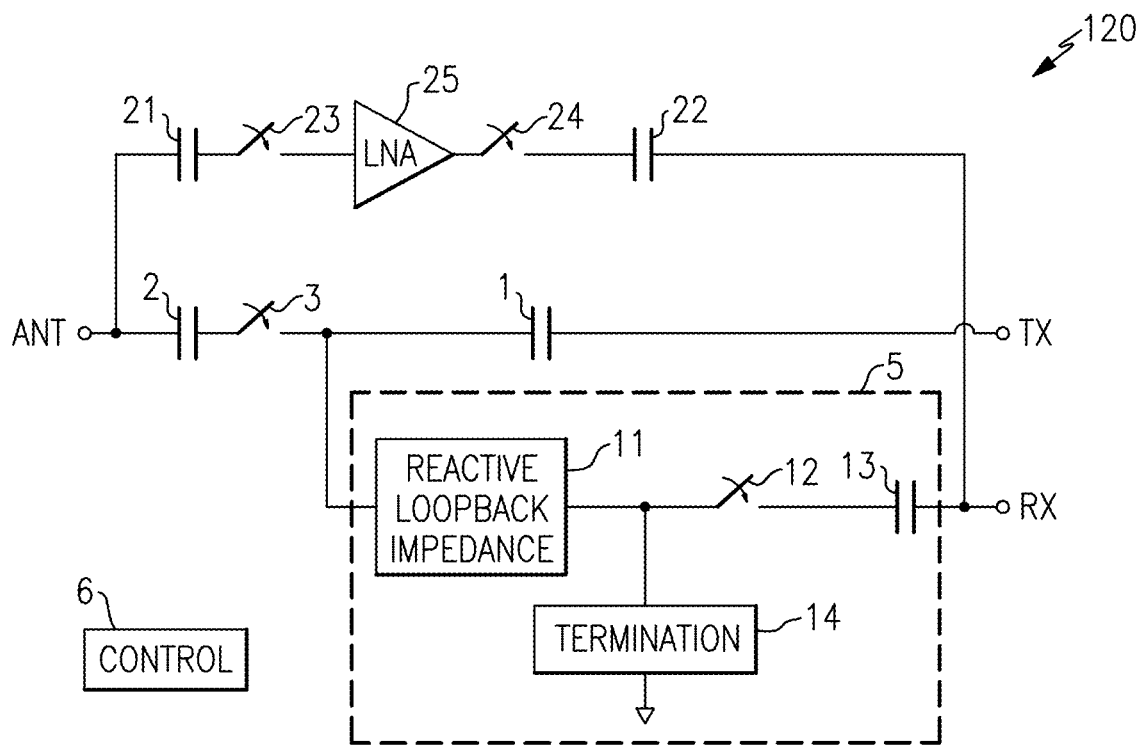
FIG. 6 is a schematic diagram of another embodiment of a front-end system with reactive loopback.

FIG. 6 is a schematic diagram of another embodiment of a front-end system 120 with reactive loopback. The front-end system 120 includes an antenna port ANT, a transmit port TX, a receive port RX, a transmit port DC blocking capacitor 1, an antenna port DC blocking capacitor 2, an antenna switch 3, a loopback circuit 5, a control circuit 6, an LNA input DC blocking capacitor 21, an LNA output DC blocking capacitor 22, an LNA input switch 23, an LNA output switch 24, and an LNA 25.

The front-end system 120 of FIG. 6 is similar to the front-end system 100 of FIG. 5, except that the front-end system 120 further includes a receive path from the antenna port ANT to the receive port RX via the LNA 25. The front-end systems herein can include a wide variety of ports, switches, paths, and circuitry. Although one specific implementation of an LNA receive path is shown in FIG. 6, other implementations are possible. Any of the front-end systems herein can be adapted to include a receive path with or without an LNA. Additionally, any of the front-end systems herein can be adapted to include a power amplifier in the transmit path.

Additional details of the front-end system 120 can be as described earlier.

Figure 7:
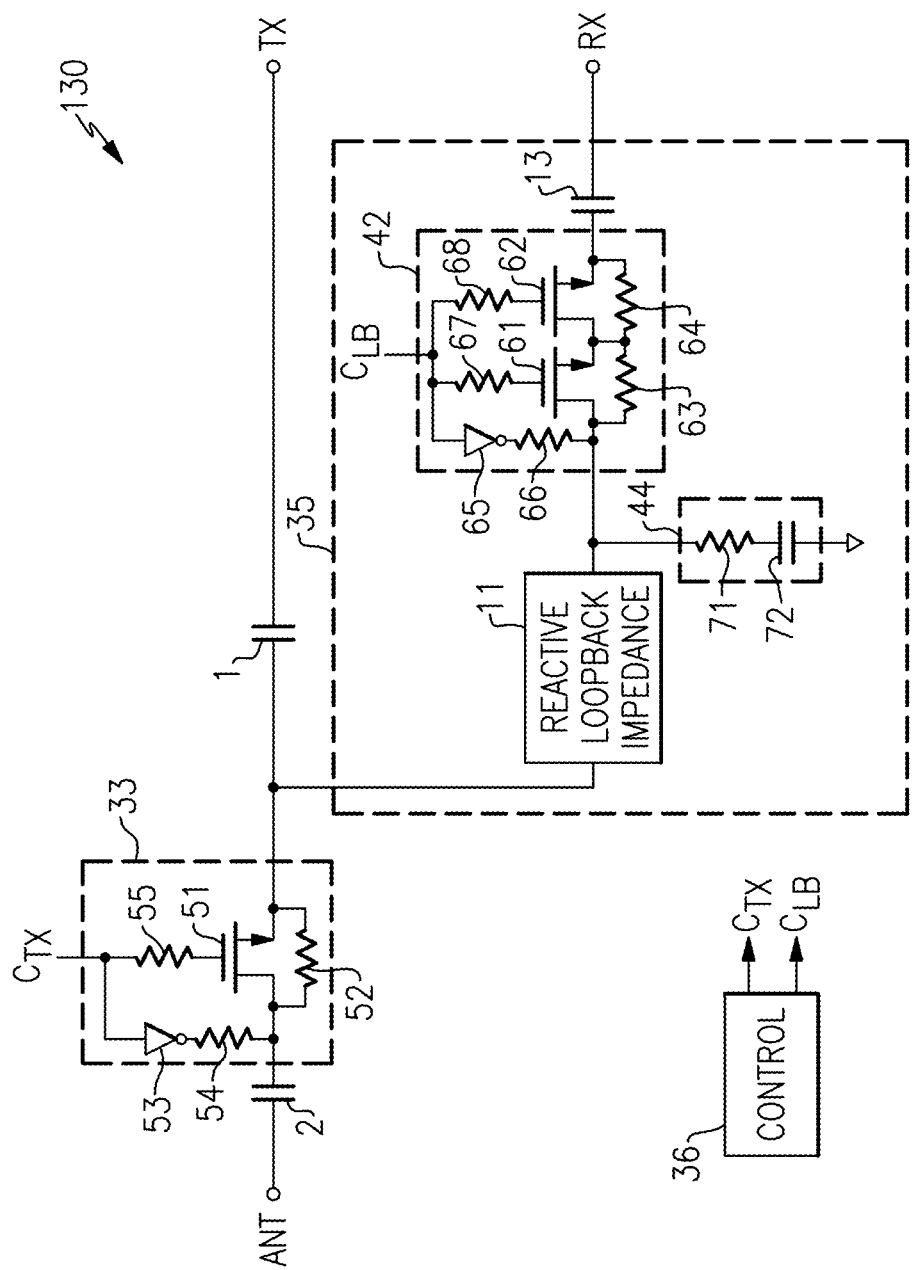
FIG. 7 is a schematic diagram of another embodiment of a front-end system with reactive loopback.

FIG. 7 is a schematic diagram of another embodiment of a front-end system 130 with reactive loopback. The front-end system 130 includes an antenna port ANT, a transmit port TX, a receive port RX, a transmit port DC blocking capacitor 1, an antenna port DC blocking capacitor 2, an antenna switch 33, a loopback circuit 35, and a control circuit 36. The loopback circuit 35 includes a reactive loopback impedance 11, a back switch 42, a receive port DC blocking capacitor 13, and a termination circuit 44.

The front-end system 130 of FIG. 7 is similar to the front-end system 100 of FIG. 5, except that the front-end system 130 of FIG. 7 illustrates specific termination circuit and switch implementations.

In particular, the termination circuit 44 includes a termination resistor 71 and a termination capacitor 72 electrically connected in series between a node of the loopback path and ground. In certain embodiments, the termination resistor 71 provides a desired termination impedance (for instance, about 50 Ohm), and the termination capacitor 72 is sufficiently large (for instance, at least 10 pF) to provide low impedance at the frequency of interest such that the termination resistor 71 provides the proper amount of termination.

The illustrated antenna switch 33 includes a field-effect transistor (FET) 51, a channel biasing resistor 52, a biasing inverter 53, an inverter output resistor 54, and a gate resistor 55. In the illustrated embodiment, a transmit selection control signal $C_{TX}$ from the control circuit 36 controls the FET 51 to selectively activate the transmit path by coupling or decoupling the transmit port TX and the antenna port ANT from one another. Additionally, the biasing inverter 53 controls the channel voltage of the FET 51 based on a state of the transmit selection control signal $C_{IA}$. The biasing inverter 53 provides negative gate-to-source voltage and high channel impedance when the FET 51 is turned off.

Although one specific implementation of an antenna switch is shown, the teachings herein are applicable to switches implemented in a wide variety of ways. For example, other types of transistors can be used. Moreover, a switch can be implemented without transistors, for instance, a pin diode switch and/or a microelectromechanical switch.

The illustrated back switch 42 includes a first FET 61, a second FET 62, a first channel biasing resistor 63, a second channel biasing resistor 64, a biasing inverter 65, an inverter output resistor 66, a first gate resistor 67, and a second gate resistor 68. As shown in FIG. 7, a loopback selection control signal $C_{LB}$ from the control circuit 36 controls the first FET 61 and the second FET 62 to selectively activate the loopback path. The back switch 42 is similar to the antenna switch 33, except that the back switch 42 includes multiple FETs in series to increase switch linearity and power handling capabilities. For example, two or more FETs can be included in series to achieve target switch performance specifications.

Although one specific implementation of a back switch is shown, the teachings herein are applicable to switches implemented in a wide variety of ways, including, but not limited to, other types of transistor switches.

Additional details of the front-end system 130 can be as described earlier.

FIGS. 8A-8F show specific implementations of a reactive loopback impedance. Although various examples are illustrated, reactive loopback impedance can be implemented in a wide variety of ways. For example, a reactive loopback impedance can be implemented with any impedance including an imaginary or reactive component. In certain implementations, a combination of components is included in the reactive loopback impedance, which can aid in enhancing robustness to manufacturing and/or a number of other advantages.

For example, in one embodiment, a reactive loopback impedance provides not only a desired amount of loopback isolation at the frequency of interest, but also serves as a filter. For example, using reactive loopback impedance also as a filter can aid in providing wide bandwidth operation relative to a single component that provides a first-order slope to the loopback circuit's frequency response.

Figure 8A:
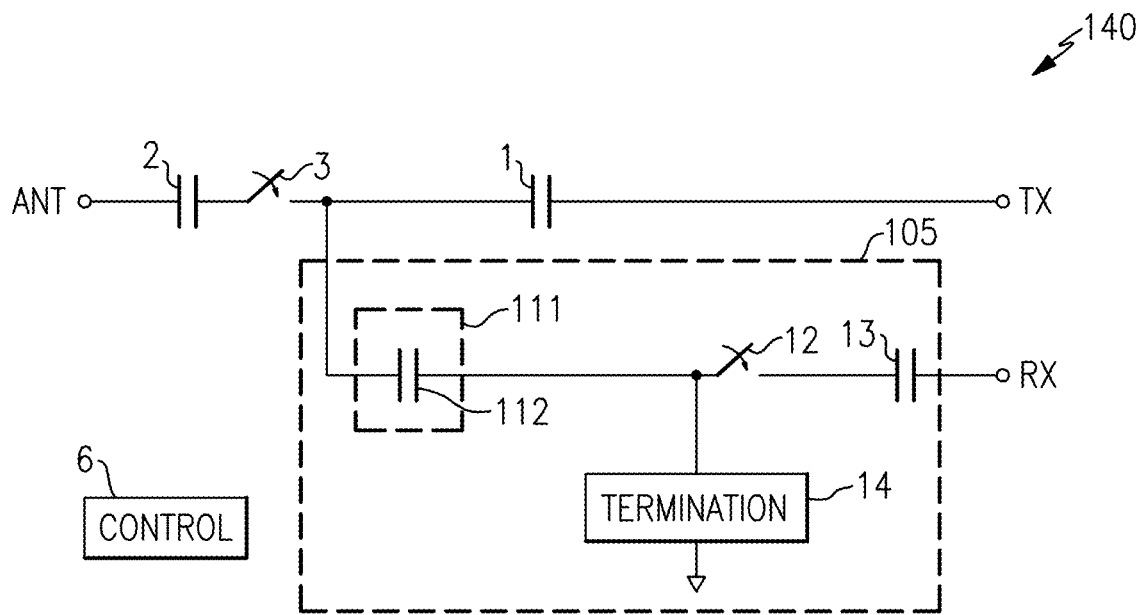
FIG. 8A is a schematic diagram of another embodiment of a front-end system with reactive loopback.

FIG. 8A is a schematic diagram of another embodiment of a front-end system 140 with reactive loopback. The front-end system 140 includes an antenna port ANT, a transmit port TX, a receive port RX, a transmit port DC blocking capacitor 1, an antenna port DC blocking capacitor 2, an antenna switch 3, a loopback circuit 105, and a control circuit 6. The loopback circuit 105 includes a reactive loopback impedance 111, a back switch 12, a receive port DC blocking capacitor 13, and a termination circuit 14. The reactive loopback impedance 111 includes a capacitor 112.

The front-end system 140 of FIG. 8A is similar to the front-end system 100 of FIG. 5, except that the front-end system 140 illustrates a specific implementation of a reactive loopback impedance.

In certain implementations, a capacitor is used to provide substantially all of a loopback isolation value. For example, a capacitor can provide an impedance of $1/(j*\omega*C_{LBK})$, where j is the imaginary unit, $\omega$ is angular frequency, and $C_{LBK}$ is the loopback capacitance. Since impedance increases inversely with capacitance, a relatively small capacitor can be used to achieve a relatively large loopback impedance. Accordingly, relatively low amounts of loopback isolation can be achieved using relatively small capacitors.

In one embodiment, a total capacitance of a reactive loopback circuit is in the range of about 25 femtofarad (fF) and 300 fF. However, other capacitance values are possible, such as capacitance values that depend on a desired amount of isolation and/or operating frequency. In certain applications, a desired amount of capacitance can be less than a smallest single capacitor (for instance, a metal-insulator-metal or MIM capacitor) can achieve in a given processing technology. In certain implementations, multiple components, such as multiple capacitors in series, can be used to achieve a desired impedance value.

Additional details of the front-end system 140 can be as described earlier.

Figure 8B:
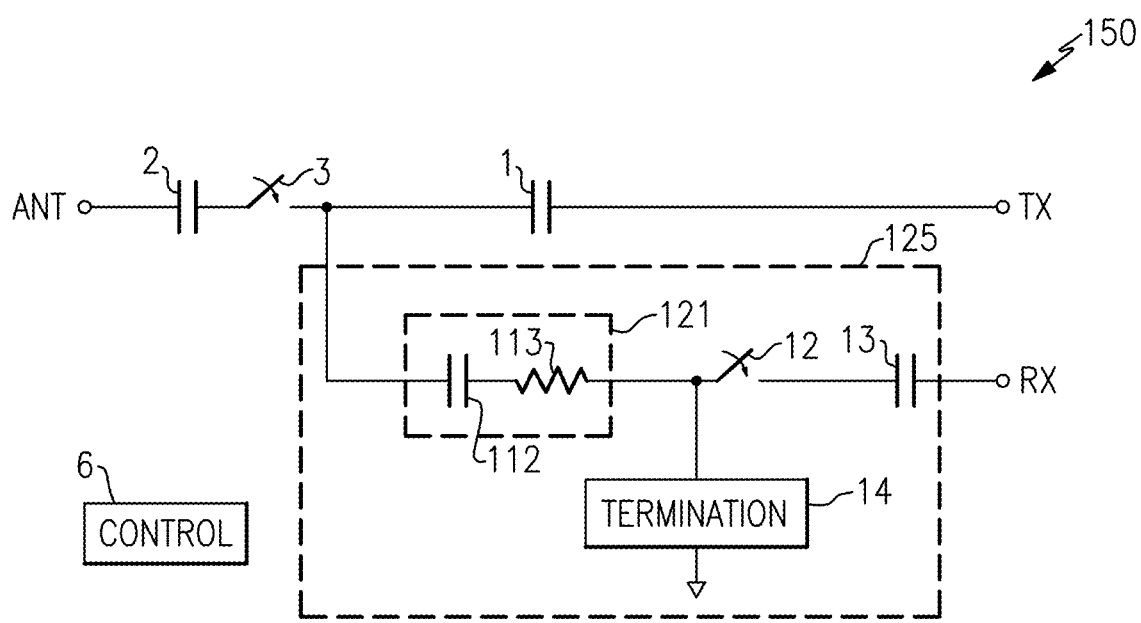
FIG. 8B is a schematic diagram of another embodiment of a front-end system with reactive loopback.

FIG. 8B is a schematic diagram of another embodiment of a front-end system 150 with reactive loopback. The front-end system 150 includes an antenna port ANT, a transmit port TX, a receive port RX, a transmit port DC blocking capacitor 1, an antenna port DC blocking capacitor 2, an antenna switch 3, a loopback circuit 125, and a control circuit 6. The loopback circuit 125 includes a loopback impedance 121, a back switch 12, a receive port DC blocking capacitor 13, and a termination circuit 14. The loopback impedance 121 includes a resistor 113 and a reactive loopback capacitor 112.

The front-end system 150 of FIG. 8B is similar to the front-end system 140 of FIG. 8A, except that the front-end system 150 of FIG. 8B includes a resistor 113 in series with the capacitor 112.

In certain implementations herein, a loopback circuit includes a loopback impedance that is mostly reactive. However, a resistor can be used in part to achieve a desired loopback impedance. For example, including a resistor to provide some loopback impedance can improve frequency characteristics, for instance, by providing lower slope over frequency for loopback and/or insertion loss. In one embodiment, a total loopback impedance of a loopback circuit has an impedance angle of at least 10 degrees, or more particularly at least 20 degrees at a frequency of interest.

Additional details of the front-end system 150 can be as described earlier.

Figure 8C:
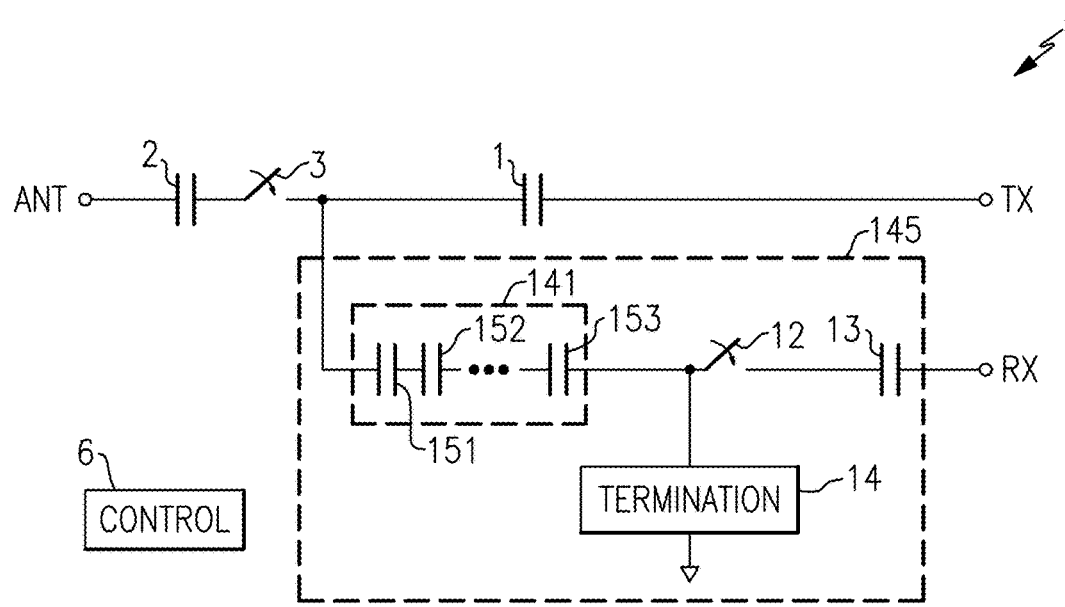
FIG. 8C is a schematic diagram of another embodiment of a front-end system with reactive loopback.

FIG. 8C is a schematic diagram of another embodiment of a front-end system 160 with reactive loopback. The front-end system 160 includes an antenna port ANT, a transmit port TX, a receive port RX, a transmit port DC blocking capacitor 1, an antenna port DC blocking capacitor 2, an antenna switch 3, a loopback circuit 145, and a control circuit 6. The loopback circuit 145 includes a reactive loopback impedance 141, a back switch 12, a receive port DC blocking capacitor 13, and a termination circuit 14. The reactive loopback impedance 141 includes capacitors 151, 152, and 153 in series.

The front-end system 160 of FIG. 8C is similar to the front-end system 100 of FIG. 5, except that the front-end system 160 illustrates a specific implementation of a reactive loopback impedance.

In particular, the illustrated reactive loopback impedance 141 includes capacitors 151, 152, and 153 in series, which aids in achieving high loopback impedance and corresponding low isolation using relatively small capacitors. Although an example with three capacitors in series is shown, more or fewer capacitors can be included in series to achieve an amount of desired reactive loopback impedance. For example, in one embodiment, two capacitors are included in series. In another embodiment, four or more capacitors are included in series to achieve desired reactive loopback impedance.

Additional details of the front-end system 160 can be as described earlier.

Figure 8D:
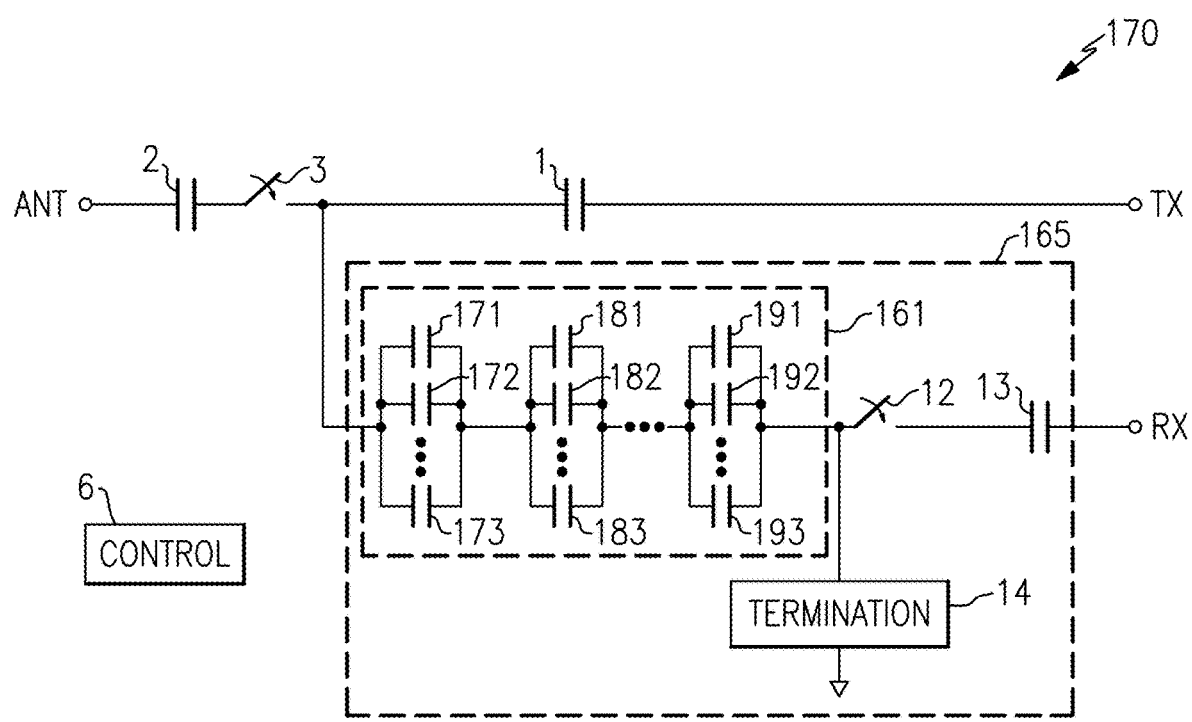
FIG. 8D is a schematic diagram of another embodiment of a front-end system with reactive loopback.

FIG. 8D is a schematic diagram of another embodiment of a front-end system 170 with reactive loopback. The front-end system 170 includes an antenna port ANT, a transmit port TX, a receive port RX, a transmit port DC blocking capacitor 1, an antenna port DC blocking capacitor 2, an antenna switch 3, a loopback circuit 165, and a control circuit 6. The loopback circuit 165 includes a reactive loopback impedance 161, a back switch 12, a receive port DC blocking capacitor 13, and a termination circuit 14.

The front-end system 170 of FIG. 8D is similar to the front-end system 100 of FIG. 5, except that the front-end system 170 illustrates a specific implementation of a reactive loopback impedance.

In particular, the illustrated reactive loopback impedance 161 includes a first capacitor array 171-173, a second capacitor array 181-183, and a third capacitor array 191-193 in series. In this example, each capacitor array includes multiple capacitors in parallel, which aids in reducing manufacturing variation, thereby achieving tighter tolerance with respect the amount of isolation provided by loopback. Moreover, connecting capacitor arrays in series achieves high loopback impedance and corresponding low isolation using relatively small capacitors.

Accordingly, the illustrated embodiment provides robustness to manufacturing variation while achieving compact layout. Although an example with three capacitors arrays in series and three capacitors per array are shown, any suitable number of capacitor arrays can be used, and different number of capacitors can be included in each array. Thus, more or fewer capacitors can be included in parallel with one another in a given array, and/or more or fewer capacitor arrays can be included in series to achieve a desired amount of reactive loopback. Moreover, the number of capacitors and/or the capacitance values used in each array need not be equal.

Additional details of the front-end system 170 can be as described earlier.

Figure 8E:
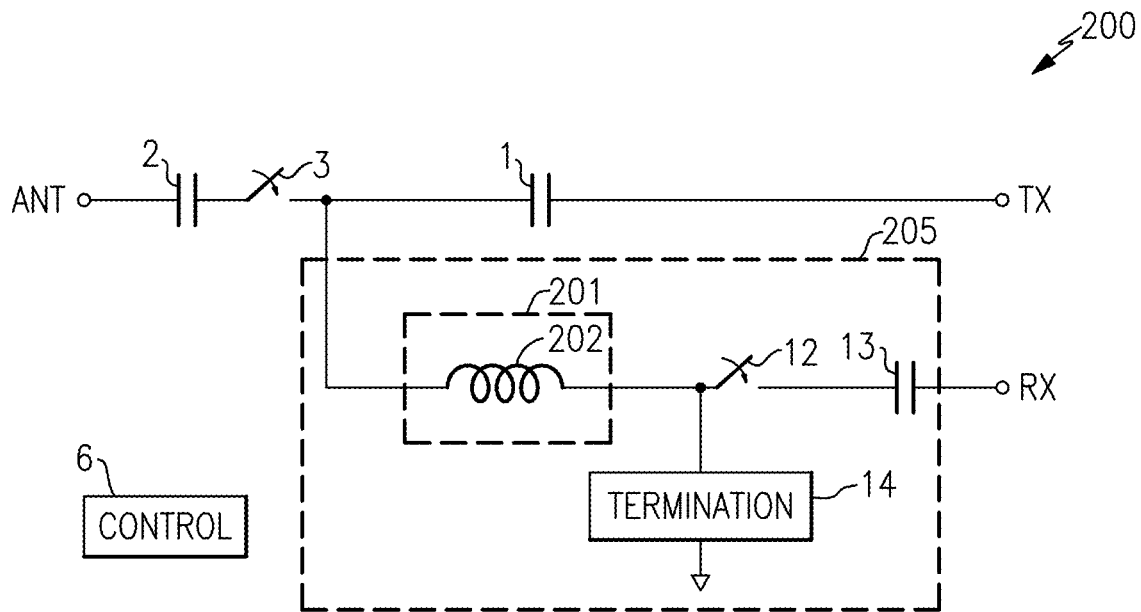
FIG. 8E is a schematic diagram of another embodiment of a front-end system with reactive loopback.

FIG. 8E is a schematic diagram of another embodiment of a front-end system 200 with reactive loopback. The front-end system 200 includes an antenna port ANT, a transmit port TX, a receive port RX, a transmit port DC blocking capacitor 1, an antenna port DC blocking capacitor 2, an antenna switch 3, a loopback circuit 205, and a control circuit 6. The loopback circuit 205 includes a reactive loopback impedance 201, a back switch 12, a receive port DC blocking capacitor 13, and a termination circuit 14. The reactive loopback impedance 201 includes an inductor 202.

The front-end system 200 of FIG. 8E is similar to the front-end system 100 of FIG. 5, except that the front-end system 200 illustrates a specific implementation of a reactive loopback impedance.

In certain implementations, an inductor is used to provide substantially all of a loopback isolation value. However, other implementations are possible, such as implementations in which a capacitor is used to provide substantially all of a loopback isolation value or a combination of an inductor and a capacitor are used to provide substantially all of a loopback isolation value. Moreover, the teachings herein are applicable to a reactive loopback impedance implemented using multiple inductors and/or capacitors.

The inductor 202 can have any suitable inductance value, such an inductance value selected based on a desired amount of isolation and/or operating frequency.

Additional details of the front-end system 200 can be as described earlier.

Figure 8F:
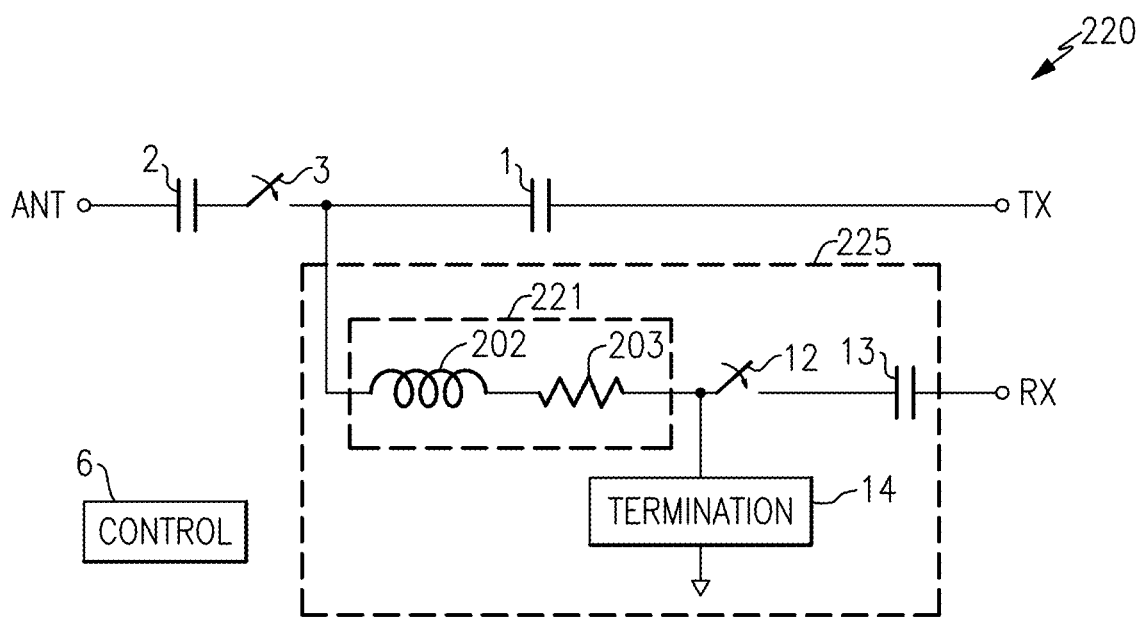
FIG. 8F is a schematic diagram of another embodiment of a front-end system with reactive loopback.

FIG. 8F is a schematic diagram of another embodiment of a front-end system 220 with reactive loopback. The front-end system 220 includes an antenna port ANT, a transmit port TX, a receive port RX, a transmit port DC blocking capacitor 1, an antenna port DC blocking capacitor 2, an antenna switch 3, a loopback circuit 225, and a control circuit 6. The loopback circuit 225 includes a loopback impedance 221, a back switch 12, a receive port DC blocking capacitor 13, and a termination circuit 14. The loopback impedance 221 includes a resistor 203 and a reactive loopback inductor 202.

The front-end system 220 of FIG. 8F is similar to the front-end system 200 of FIG. 8E, except that the front-end system 220 of FIG. 8F further includes the resistor 203 in series with the inductor 202.

In certain implementations herein, a loopback circuit includes a loopback impedance that is mostly reactive. However, a resistor can be used in part to achieve a desired loopback impedance.

Additional details of the front-end system 220 can be as described earlier.

Figure 9A:
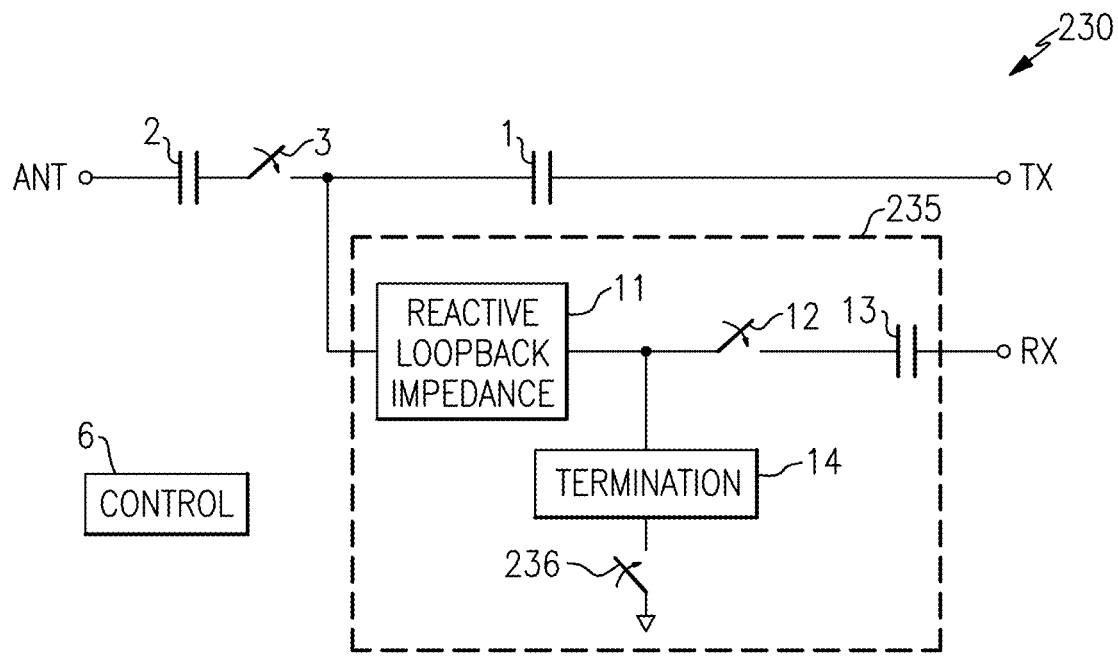
FIG. 9A is a schematic diagram of another embodiment of a front-end system with reactive loopback.

FIG. 9A is a schematic diagram of another embodiment of a front-end system 230 with reactive loopback. The front-end system 230 includes an antenna port ANT, a transmit port TX, a receive port RX, a transmit port DC blocking capacitor 1, an antenna port DC blocking capacitor 2, an antenna switch 3, a control circuit 6, and a loopback circuit 235. The loopback circuit 235 includes a reactive loopback impedance 11, a back switch 12, a receive port DC blocking capacitor 13, a termination circuit 14, and an isolation switch 236. The reactive loopback impedance 11 can be implemented in a wide variety of ways, including, but not limited to, using any of implementations described above with respect to FIGS. 8A-8F.

The front-end system 230 of FIG. 9A is similar to the front-end system 100 of FIG. 5, except that the front-end system 230 further includes the isolation switch 236. In the illustrated embodiment, the isolation switch 236 is positioned between the termination circuit 14 and ground.

Including the isolation switch 236 can aid in further isolating the transmit path from the loopback circuit 235 when loopback is deactivated or disabled. For example, in certain implementations both the back switch 12 and the isolation switch 236 are opened when loopback is disabled or deactivated, and both closed when loopback is enabled or activated. Including the isolation switch 236 can further reduce undesired loading of the transmit path by the loopback circuit 235 when the loopback circuit 235 is turned off.

Figure 9B:
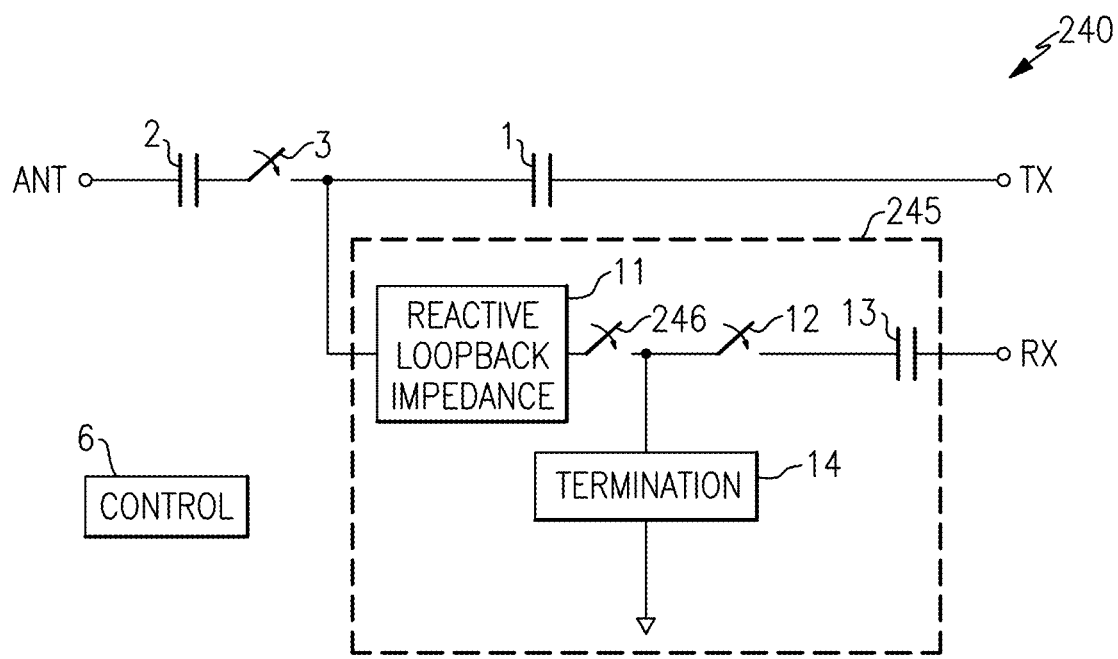
FIG. 9B is a schematic diagram of another embodiment of a front-end system with reactive loopback.

FIG. 9B is a schematic diagram of another embodiment of a front-end system 240 with reactive loopback. The front-end system 240 includes an antenna port ANT, a transmit port TX, a receive port RX, a transmit port DC blocking capacitor 1, an antenna port DC blocking capacitor 2, an antenna switch 3, a control circuit 6, and a loopback circuit 245. The loopback circuit 245 includes a reactive loopback impedance 11, a back switch 12, a receive port DC blocking capacitor 13, a termination circuit 14, and an isolation switch 246. The reactive loopback impedance 11 can be implemented in a wide variety of ways, including, but not limited to, using any of implementations described above with respect to FIGS. 8A-8F.

The front-end system 240 of FIG. 9B is similar to the front-end system 100 of FIG. 5, except that the front-end system 240 further includes the isolation switch 246. In the illustrated embodiment, the isolation switch 246 is positioned between the reactive loopback impedance 11 and the termination circuit 14. Including the isolation switch 246 can aid in further isolating the transmit path of the front-end system from the loopback circuit 245 when loopback is deactivated.

Figure 9C:
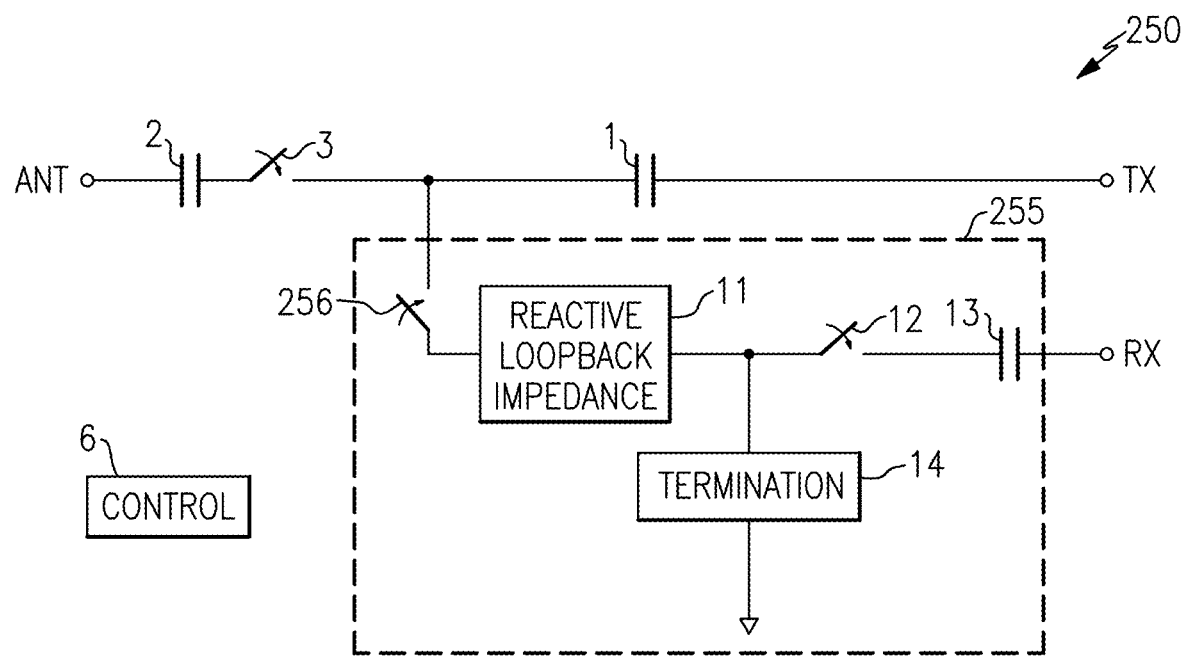
FIG. 9C is a schematic diagram of another embodiment of a front-end system with reactive loopback.

FIG. 9C is a schematic diagram of another embodiment of a front-end system 250 with reactive loopback. The front-end system 250 includes an antenna port ANT, a transmit port TX, a receive port RX, a transmit port DC blocking capacitor 1, an antenna port DC blocking capacitor 2, an antenna switch 3, a control circuit 6, and a loopback circuit 255. The loopback circuit 255 includes a reactive loopback impedance 11, a back switch 12, a receive port DC blocking capacitor 13, a termination circuit 14, and an isolation switch 256. The reactive loopback impedance 11 can be implemented in a wide variety of ways, including, but not limited to, using any of implementations described above with respect to FIGS. 8A-8F.

The front-end system 250 of FIG. 9C is similar to the front-end system 100 of FIG. 5, except that the front-end system 250 further includes the isolation switch 256. In the illustrated embodiment, the isolation switch 256 is positioned between the transmit path and the reactive loopback impedance 11. Including the isolation switch 256 can aid in further isolating the transmit path of the front-end system from the loopback circuit 255 when loopback is deactivated.

Although various examples of switch implementations are shown in FIGS. 9A-9C, the teachings herein are applicable to front-end systems including switches implemented in a wide variety of ways. For example, the number and placement of switches can be selected based on a wide variety of factors and considerations.

Figure 10A:
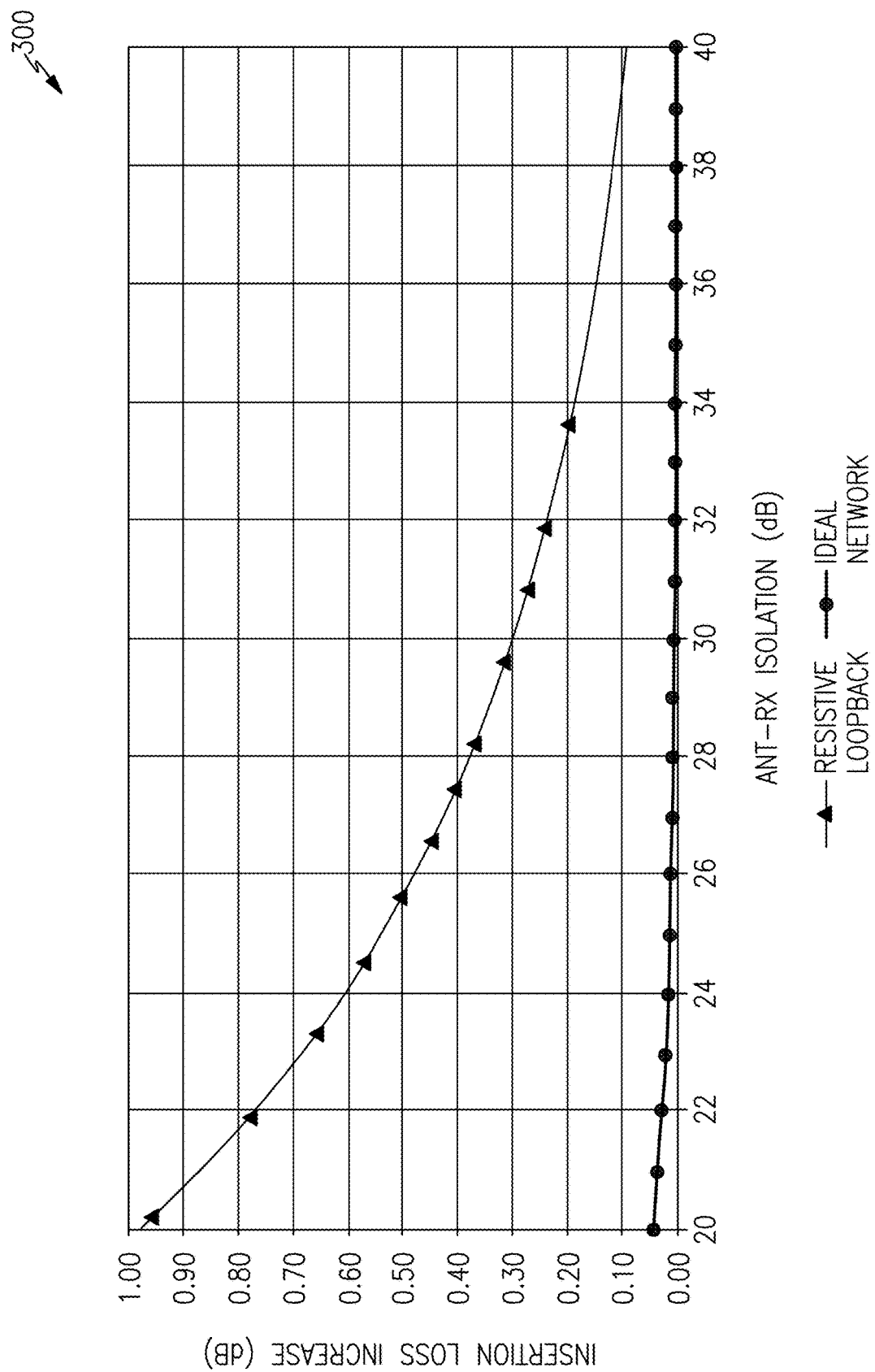
FIG. 10A is a graph of one example of insertion loss increase versus loopback isolation.

FIG. 10A is a graph 300 of one example of insertion loss increase versus loopback isolation. The graph 300 illustrates insertion loss increase in decibels (dB) (relative to a case of no loopback) versus the amount of isolation of the loopback path in dB. The graph 300 includes a first plot for a resistive loopback circuit simulated with parasitic components extracted from layout and accounting for energy loss from resistive heating. The graph 300 includes a second plot for the resistive loopback circuit based on a predicted insertion loss from three-port network theory.

As shown in FIG. 10A, using a resistive loopback impedance can lead to an increase in insertion loss beyond the predicted insertion loss from three-port network theory.

Figure 10B:
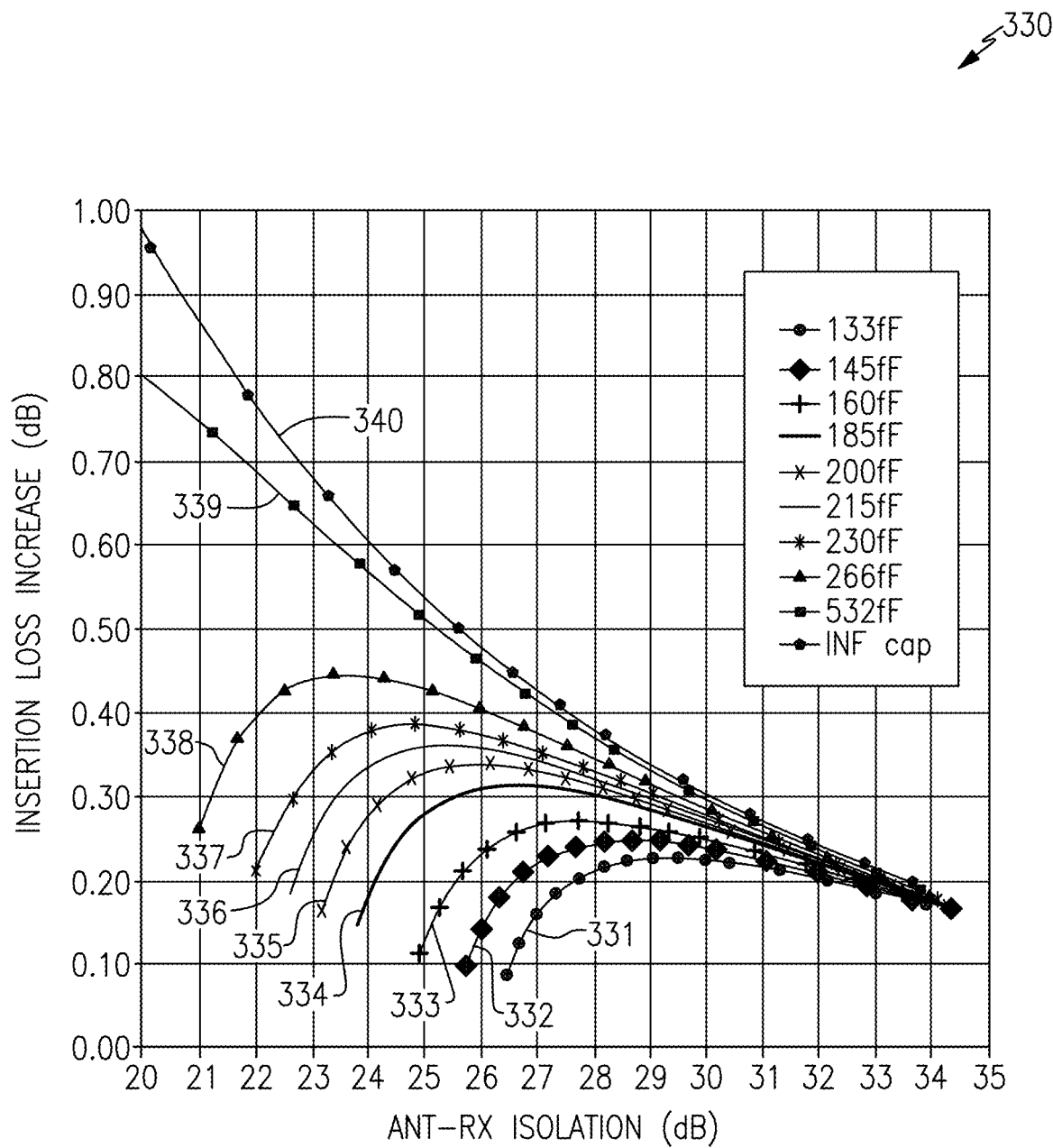
FIG. 10B is a graph of another example of insertion loss increase versus loopback isolation.

FIG. 10B is a graph 330 of another example of insertion loss increase versus loopback isolation. The graph 330 illustrates insertion loss increase in dB (relative to a case of no loopback) versus the amount of isolation of the loopback path in dB. The graph 330 includes first to tenth plots 331-340, respectively, corresponding to a different amount of fixed capacitance, with the amount of resistance swept from 0Ω to 1 kΩ to achieve different amounts of isolation. The first to tenth plots 331-340 correspond to capacitance values of 133 fF, 145 fF, 160 fF, 185 fF, 200 fF, 215 fF, 230 fF, 266 fF, 532 fF, and infinite (INF), respectively.

As shown in FIG. 10B, loss increases as the proportion of resistance used to implement the loopback impedance is increased.

Figure 11A:
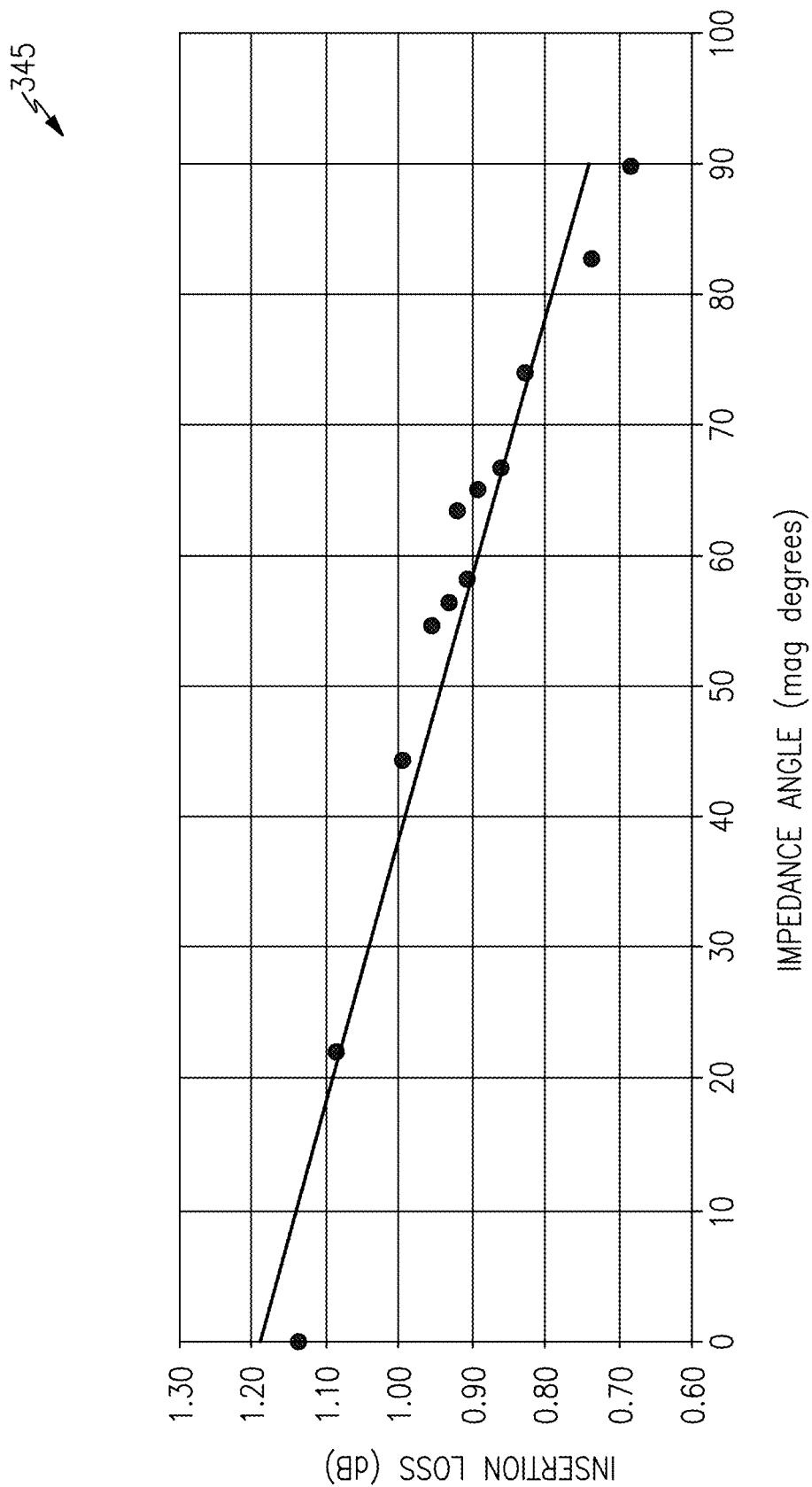
FIG. 11A is a graph of one example of insertion loss versus impedance angle for a loopback isolation of about 25 decibels (dB).

FIG. 11A is a graph 345 of one example of insertion loss versus impedance angle for a loopback isolation of about 25 dB. Each point of the graph 345 illustrates a different combination of resistance and capacitance values used to achieve 25 dB of loopback isolation at 2.4 GHz, within a tolerance of +/−0.5 dB.

Figure 11B:
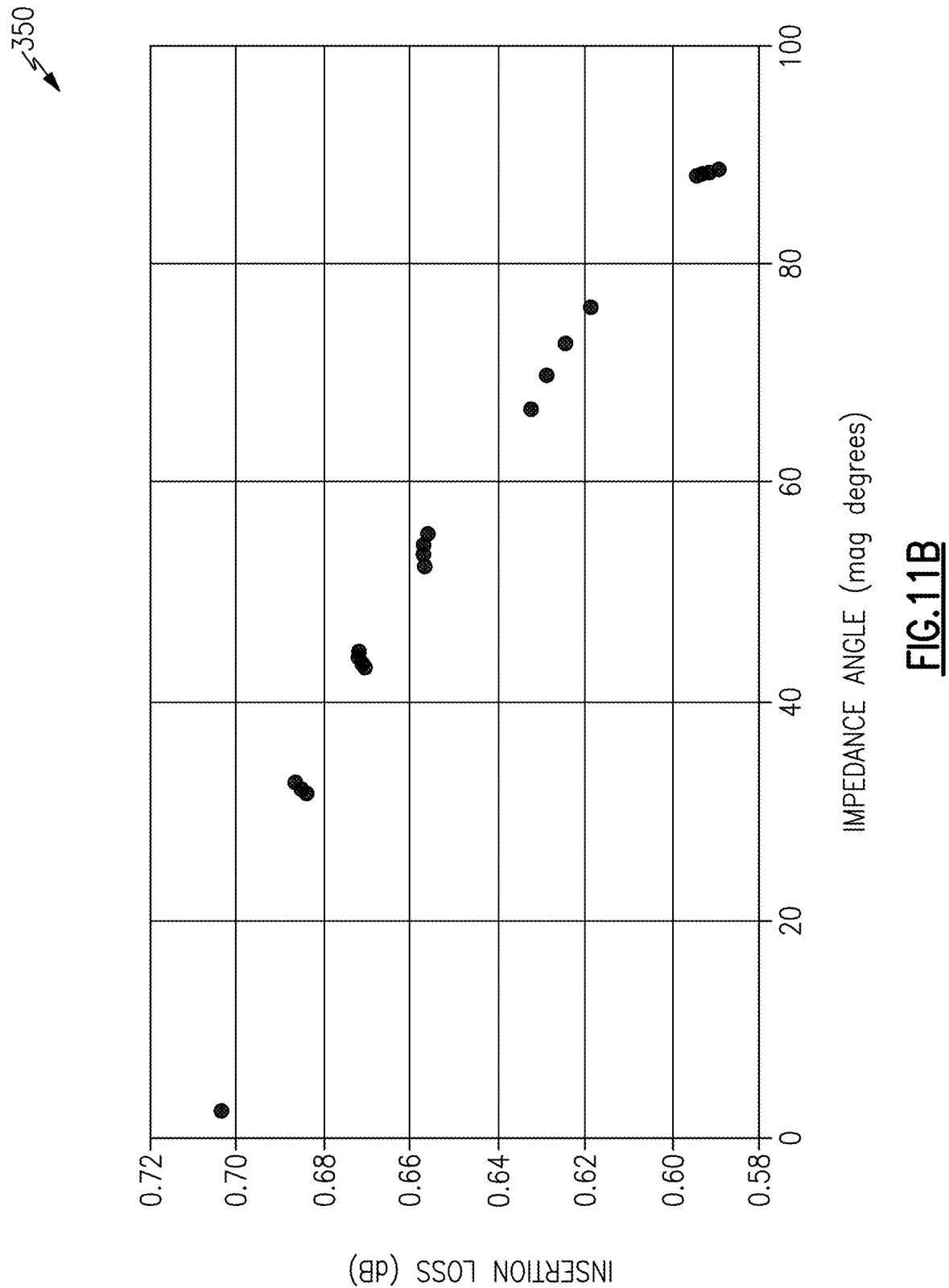
FIG. 11B is a graph of one example of insertion loss versus impedance angle for a loopback isolation of about 37.16 dB.

FIG. 11B is a graph 350 of one example of insertion loss versus impedance angle for a loopback isolation of about 37.16 dB. Each point of the graph 350 illustrate a different combination of resistance and capacitance values used to achieve 37.16 dB of loopback isolation at 2.4 GHz, within a tolerance of +/−0.35 dB.

As shown in FIGS. 11A and 11B, as impedance angle increases (indicating a greater proportion of reactive impedance relative to resistance impedance), insertion loss is improved. For instance, in the particular example simulation of FIG. 11A, replacing a resistive impedance with a reactive impedance achieves about 37 dB of isolation with about 0.6 dB of insertion loss. Additionally, in the particular example simulation of FIG. 11B, replacing a resistive impedance with a reactive impedance achieves about 25 dB of isolation with about 0.7 dB of insertion loss. In contrast, 25 dB loopback with a resistor suffers from an insertion loss that is about 0.5 dB poorer.

Although specific examples of simulation results for a front-end are shown in FIGS. 10A-11B, other simulations results are possible. For example, simulation results can vary based on a wide variety of factors, including, but not limited to, simulation parameters (including operating frequency), circuit topology, and/or fabrication processes.

Examples of Front-End Systems with Reactive Loopback Impedance and a Shared Back Switch A front-end system can include a combination of reactive loopback impedance and a shared back switch. Implementing a front-end system in this manner can provide the benefits of low insertion loss in a transmit path along with reduced area, complexity, and/or layout congestion associated with a shared back switch.

Although one embodiment of a front-end system including both a reactive loopback impedance and a shared back switch is illustrated, the teachings herein are applicable to a wide variety of configurations. For example, any of the front-end systems of FIGS. 5-9C can include multiple loopbacks using a shared back switch. Additionally, any of the front-end systems of FIGS. 1A-4 can include reactive loopback impedance in one or more of the loopback paths.

Figure 12:
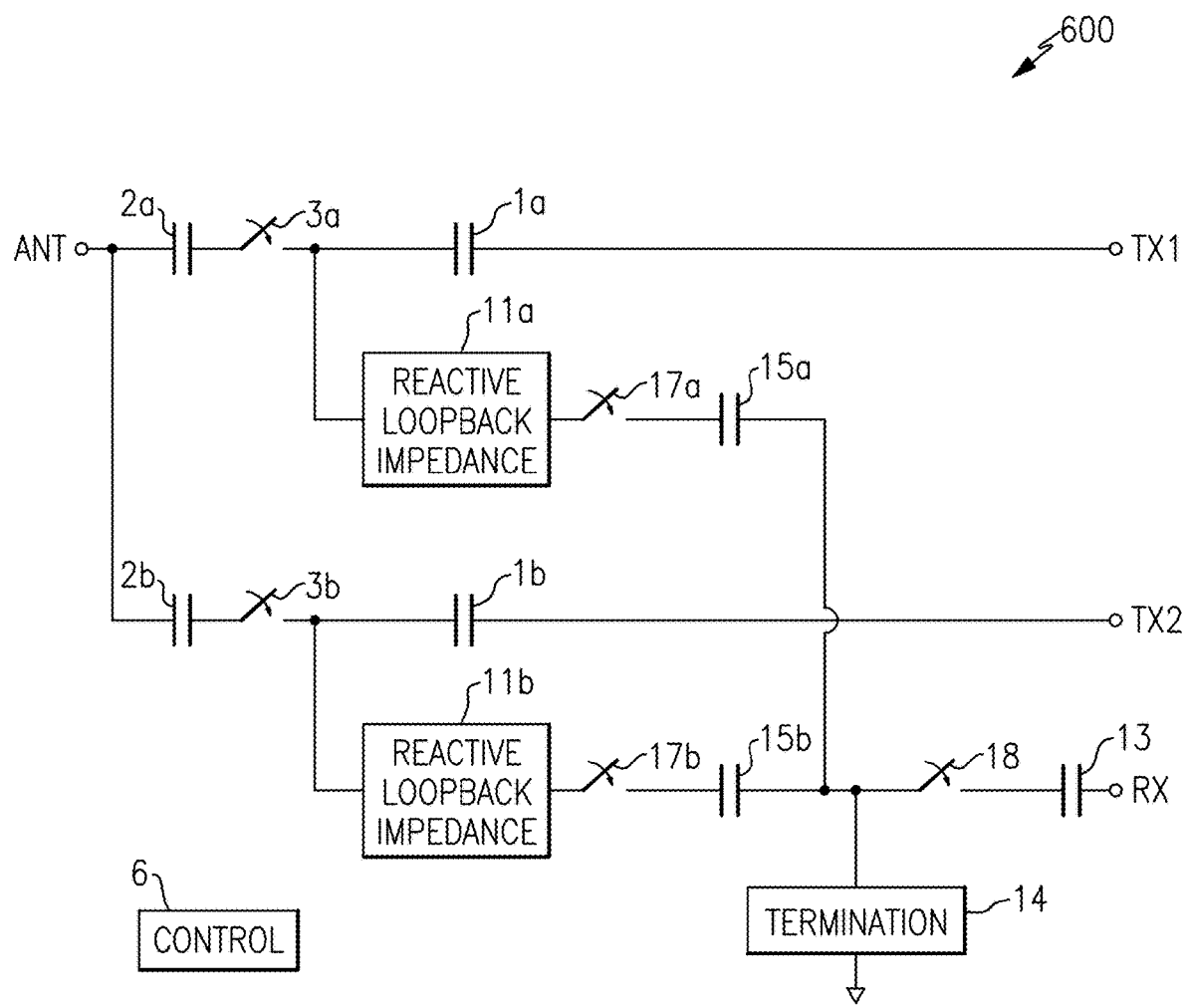
FIG. 12 is a schematic diagram of one embodiment of a front-end system with reactive loopback and with multiple loopbacks sharing a back switch.

FIG. 12 is a schematic diagram of one embodiment of a front-end system 600 with reactive loopback and with multiple loopbacks sharing a back switch. The front-end system 600 includes an antenna port ANT, a first transmit port TX1, a second transmit port TX2, a receive port RX, a first transmit port DC blocking capacitor 1a, a second transmit port DC blocking capacitor 1b, a first antenna port DC blocking capacitor 2a, a second antenna port DC blocking capacitor 2b, a first antenna switch 3a, a second antenna switch 3b, a control circuit 6, a first reactive loopback impedance 11a, a second reactive loopback impedance 11b, a receive port DC blocking capacitor 13, a termination circuit 14, a first loopback DC blocking capacitor 15a, a second loopback DC blocking capacitor 15b, a first loopback selection switch 17a, a second loopback selection switch 17b, and a shared back switch 18.

Additional details of the front-end system 600 can be similar to those described earlier.

Examples Radio Frequency Systems including a Front-End

Figure 13A:
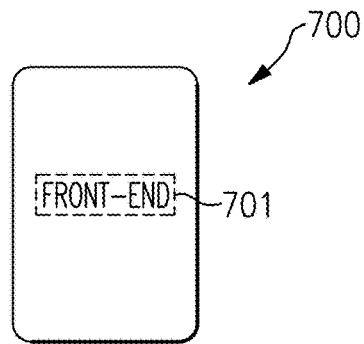
FIG. 13A is a schematic diagram of one embodiment of a mobile device.

FIG. 13A is a schematic diagram of one embodiment of a mobile device 700. The mobile device 700 includes a front-end system 701, which can include a reactive loopback impedance and/or a shared back switch. Although not illustrated in FIG. 13A for clarity, the mobile device 700 includes additional components and structures.

Figure 13B:
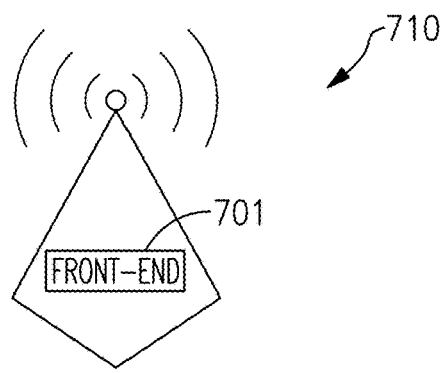
FIG. 13B is a schematic diagram of one embodiment of a base station.

FIG. 13B is a schematic diagram of one embodiment of a base station 710. The base station 710 includes a front-end system 701, which can include a reactive loopback impedance and/or a shared back switch. Although not illustrated in FIG. 13B for clarity, the base station 710 includes additional components and structures.

Figure 14:
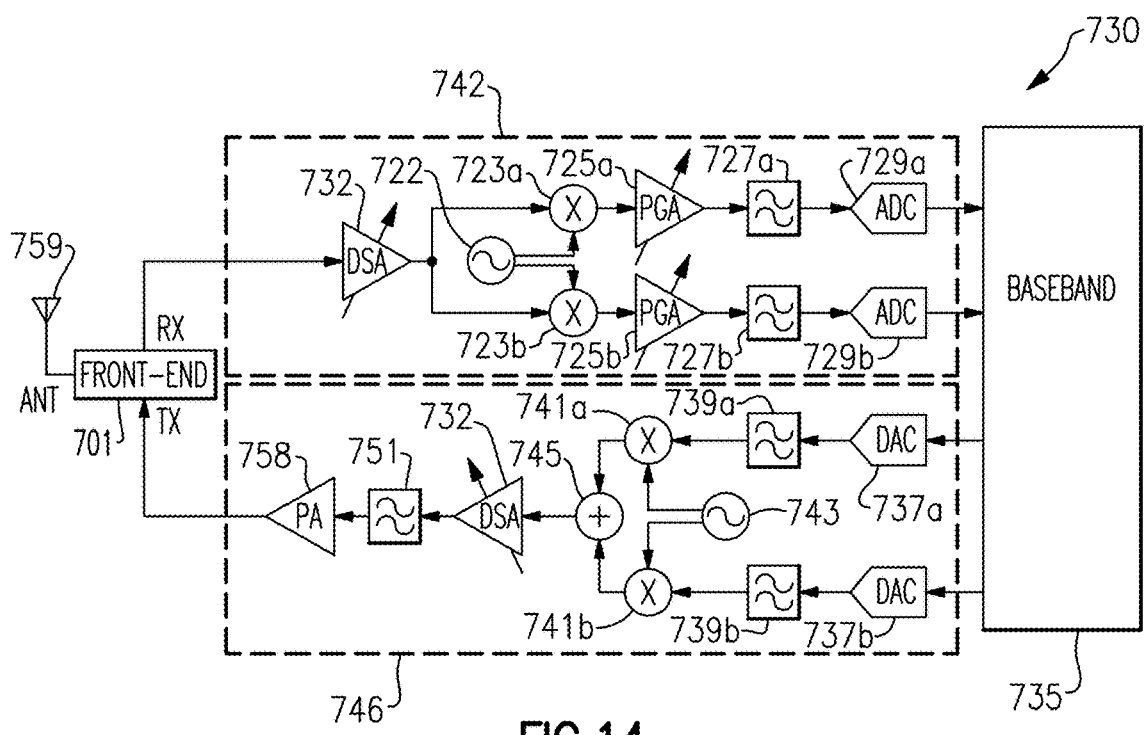
FIG. 14 is a schematic diagram of one embodiment of a radio frequency system.

FIG. 14 is a schematic diagram of one embodiment of a radio frequency system 730. The RF system 730 includes a baseband processor 735, a receive circuit 742, a transmit circuit 746, a front-end system 701, and an antenna 759. The RF system 730 illustrates one example implementation of radio frequency circuitry suitable for operation in a mobile device or base station. However, mobile devices and base stations can be implemented in a wide variety of ways.

The RF system 730 can be used for transmitting and/or receiving RF signals using a variety of communication standards, including, for example, Global System for Mobile Communications (GSM), Code Division Multiple Access (CDMA), wideband CDMA (W-CDMA), Long Term Evolution (LTE), Advanced LTE, 3G (including 3GPP), 4G, Enhanced Data Rates for GSM Evolution (EDGE), wireless local loop (WLL), and/or Worldwide Interoperability for Microwave Access (WiMax), as well as other proprietary and non-proprietary communications standards.

The transmit circuit 746 and the receive circuit 742 can be used for transmitting and receiving signals over the antenna 759. Although one implementation of the RF system 730 is illustrated in FIG. 14, the RF system 730 can be modified in any suitable manner. For example, the base station 730 can be modified to include additional transmit circuits, receive circuits, front-ends, and/or antennas.

In the illustrated configuration, the receive circuit 742 includes a digital step attenuator (DSA) 732, a local oscillator 722, a first mixer 723a, a second mixer 723b, a first programmable gain amplifier (PGA) 725a, a second PGA 725b, a first filter 727a, a second filter 727b, a first analog-to-digital converter (ADC) 729a, and a second ADC 729b. Although one implementation of a receive circuit is illustrated in FIG. 14, a receive circuit can include more or fewer components and/or a different arrangement of components.

An RF signal can be received on the antenna 759 and provided to the receive circuit 742 using the front-end system 701. For example, the front-end system 701 can be controlled to electrically couple the antenna 759 to an input of the DSA 732. In the illustrated embodiment, an amount of attenuation provided by the DSA 732 is digitally-controllable, and can be set to achieve a desired signal power level.

The first and second mixers 723a, 723b receive first and second local oscillator clock signals, respectively, from the local oscillator 722. The first and second local oscillator clock signals can have about the same frequency and a phase difference equal to about a quarter of a period, or about 90°. The first and second mixers 723a, 723b downconvert the output of the DSA 732 using the first and second local oscillator clock signals, respectively, thereby generating first and second demodulated signals. The first and second demodulated signals can have a relative phase difference of about a quarter of a period, or about 90°, and can correspond to an in-phase (I) receive signal and a quadrature-phase (Q) signal, respectively. In certain implementations, one of the first or second oscillator clock signals is generated by phase shifting from the other.

The first and second local oscillator clock signals can have a frequency selected to achieve a desired intermediate frequency and/or baseband frequency for the first and second demodulated signals. For example, multiplying the output of the DSA 732 by a sinusoidal signal from the local oscillator 722 can produce a mixed signal having a frequency content centered about the sum and difference frequencies of the carrier frequency of the DSA output signal and the oscillation frequency of the local oscillator 722.

In the illustrated configuration, the first and second demodulated signals are amplified using the first and second programmable gain amplifiers 725a, 725b, respectively. To aid in reducing output noise, the outputs of the first and second programmable gain amplifiers 725a, 725b can be filtered using the first and second filters 727a, 727b, which can be any suitable filter, including, for example, low pass, band pass, or high pass filters. The outputs of the first and second filters 727a, 727b can be provided to the first and second ADCs 729a, 729b, respectively. The first and second ADCs 729a, 729b can have any suitable resolution. In the illustrated configuration, the outputs of the first and second ADCs 729a, 729b are provided to the baseband processor 735 for processing.

The baseband processor 735 can be implemented in a variety of ways. For instance, the baseband processor 735 can include a digital signal processor, a microprocessor, a programmable core, the like, or any combination thereof. Moreover, in some implementations, two or more baseband processors can be included in the RF system 730.

As shown in FIG. 14, the transmit circuit 746 receives data from the baseband processor 735 and is used to transmit RF signals via the antenna 759. The transmit circuit 746 and the receive circuit 742 both operate using the antenna 759, and access to the antenna 759 is controlled using the front-end system 701. The illustrated transmit circuit 746 includes first and second digital-to-analog converters (DACs) 737a, 737b, first and second filters 739a, 739b, first and second mixers 741a, 741b, a local oscillator 743, a combiner 745, a DSA 732, an output filter 751, and a power amplifier 758. Although one implementation of a transmit circuit is illustrated in FIG. 14, a transmit circuit can include more or fewer components and/or a different arrangement of components.

The baseband processor 735 can output a digital in-phase (I) signal and a digital quadrature-phase (Q) signal, which can be separately processed until they are combined using the combiner 745. The first DAC 737a converts the digital I signal into an analog I signal, and the second DAC 737b converts the digital Q signal into an analog Q signal. The first and second DACs 737a, 737b can have any suitable precision. The analog I signal and the analog Q signal can be filtered using the first and second filters 739a, 739b, respectively. The outputs of the first and second filters 739a, 739b can be upconverted using the first and second mixers 741a, 741b, respectively. For example, the first mixer 741a is used to upconvert the output of the first filter 739a based on an oscillation frequency of the local oscillator 743, and the second mixer 741b is used to upconvert the output of the second filter 739b based on the oscillation frequency of the local oscillator 743.

The combiner 745 combines the outputs of the first and second mixers 741a, 741b to generate a combined RF signal. The combined RF signal is provided to an input of the DSA 732, which is used to control a signal power level of the combined RF signal.

The output of the DSA 732 can be filtered using the output filter 751, which can be, for example, a low pass, band pass, or high pass filter configured to remove noise and/or unwanted frequency components from the signal. The output of the output filter 751 can be amplified by a power amplifier 758. In some implementations, the power amplifier 758 includes a plurality of stages cascaded to achieve a target gain. The power amplifier 758 can provide an amplified RF signal to the antenna 759 through the front-end system 701.

The front-end system 701 of FIG. 14 can be implemented using one or more features discloses herein. Although FIG. 14 illustrates one example of an RF system that can include a front-end system implemented in accordance with the teachings herein, the front-end systems herein can be used in other configurations of electronics.

Figure 15A:
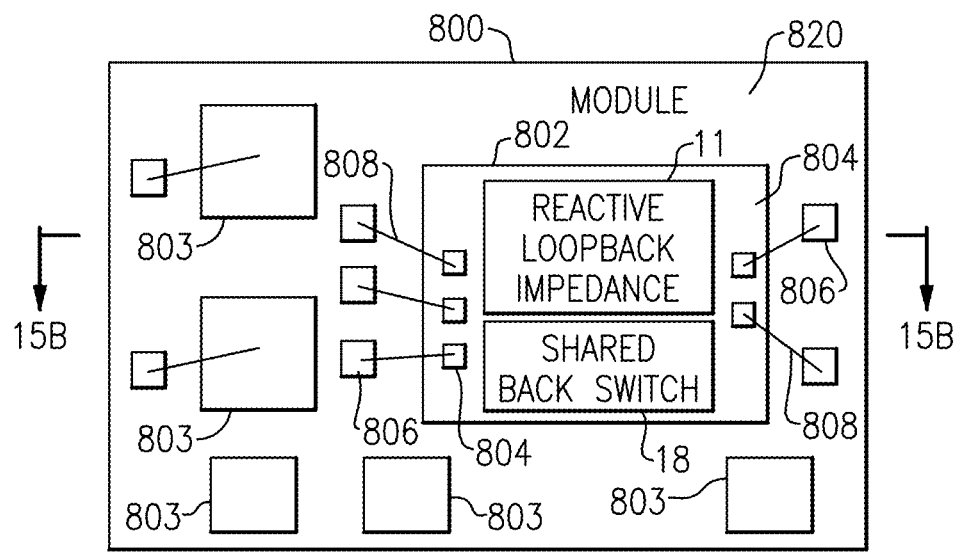
FIG. 15A is a schematic diagram of one embodiment of a packaged module.
Figure 15B:
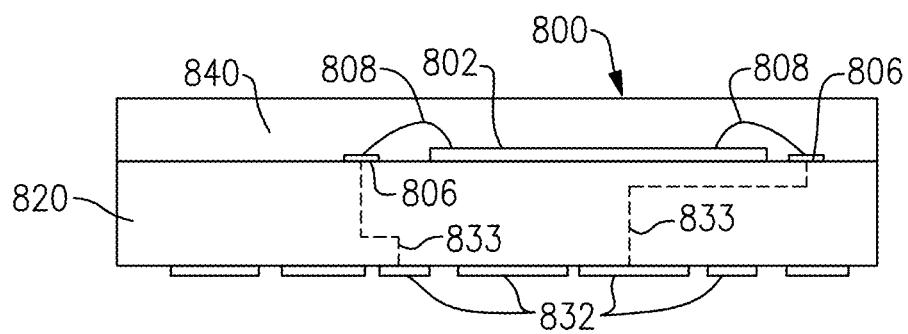
FIG. 15B is a schematic diagram of a cross-section of the packaged module of FIG. 15A taken along the lines 15B-15B.

FIG. 15A is a schematic diagram of one embodiment of a packaged module 800. FIG. 15B is a schematic diagram of a cross-section of the packaged module 800 of FIG. 15A taken along the lines 15B-15B.

The packaged module 800 includes a semiconductor die 802, surface mount components 803, wirebonds 808, a package substrate 820, and encapsulation structure 840. The package substrate 820 includes pads 806 formed from conductors disposed therein. Additionally, the semiconductor die 802 includes pins or pads 804, and the wirebonds 808 have been used to connect the pads 804 of the die 802 to the pads 806 of the package substrate 820.

The semiconductor die 802 implements a front-end system that includes at least one of a reactive loopback impedance 11 or a shared back switch 18.

The package substrate 820 can be configured to receive a plurality of components such as the semiconductor die 802 and the surface mount components 803, which can include, for example, surface mount capacitors and/or inductors. In certain implementations, the packaged module 800 includes multiple semiconductor dies attached to the package substrate 820.

As shown in FIG. 15B, the packaged module 800 is shown to include a plurality of contact pads 832 disposed on the side of the packaged module 800 opposite the side used to mount the semiconductor die 802. Configuring the packaged module 800 in this manner can aid in connecting the packaged module 800 to a circuit board, such as a phone board of a wireless device. The example contact pads 832 can be configured to provide radio frequency signals, bias signals, and/or power (for example, a power supply voltage and ground) to the semiconductor die 802 and/or the surface mount components 803. As shown in FIG. 15B, the electrical connections between the contact pads 832 and the semiconductor die 802 can be facilitated by connections 833 through the package substrate 820. The connections 833 can represent electrical paths formed through the package substrate 820, such as connections associated with vias and conductors of a multilayer laminated package substrate.

In some embodiments, the packaged module 800 can also include one or more packaging structures to, for example, provide protection and/or facilitate handling. Such a packaging structure can include overmold or encapsulation structure 840 formed over the package substrate 820 and the components and die(s) disposed thereon.

It will be understood that although the packaged module 800 is described in the context of electrical connections based on wirebonds, one or more features of the present disclosure can also be implemented in other packaging configurations, including, for example, flip-chip configurations.

Figure 16:
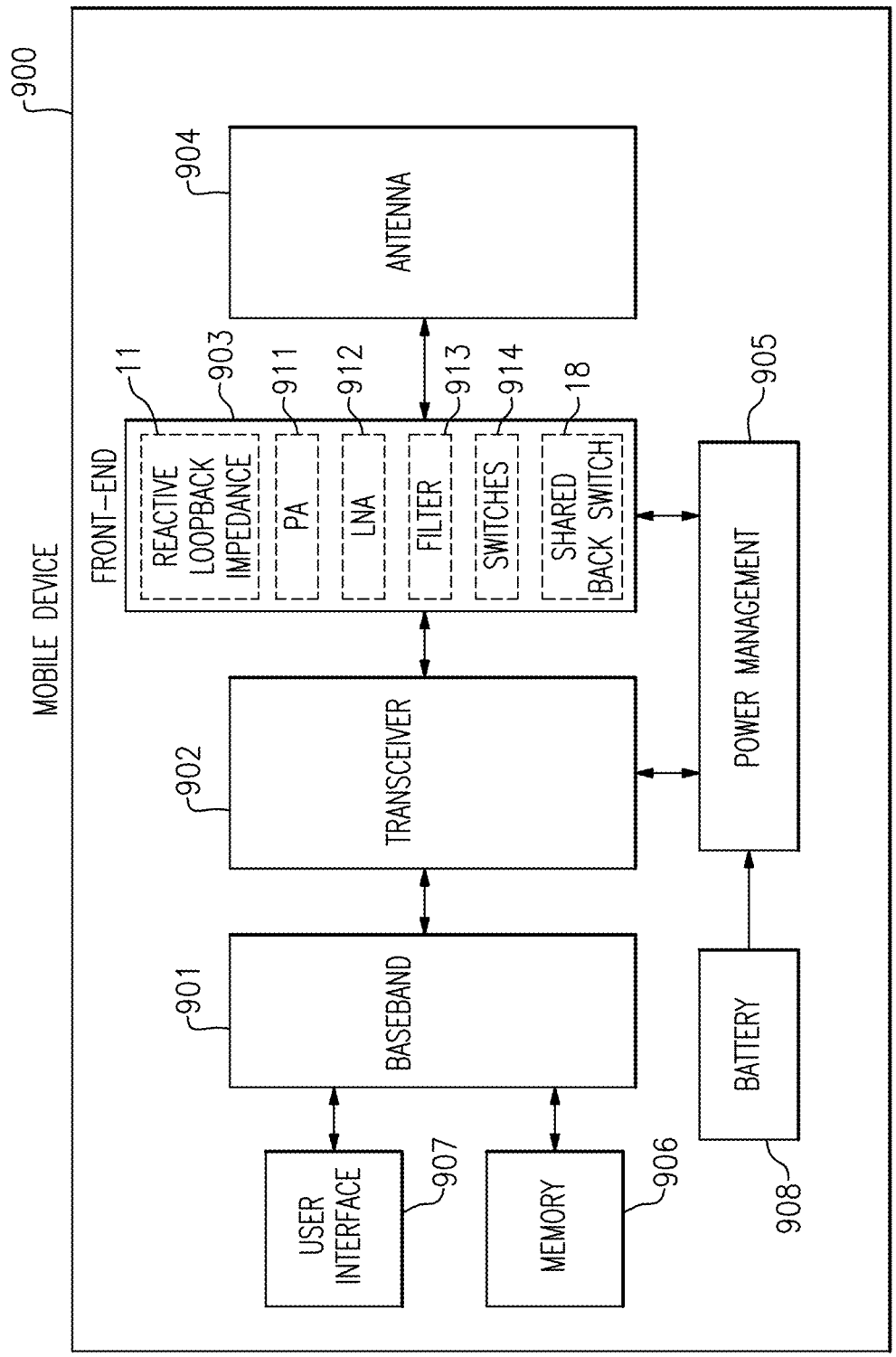
FIG. 16 is a schematic diagram of another embodiment of a mobile device.

FIG. 16 is a schematic diagram of another embodiment of a mobile device 900. The mobile device 900 includes a baseband system 901, a transceiver 902, a front-end system 903, an antenna 904, a power management system 905, a memory 906, a user interface 907, and a battery 908.

The mobile device 900 can be used communicate using a wide variety of communications technologies, including, but not limited to, 2G, 3G, 4G (including LTE, LTE-Advanced, and LTE-Advanced Pro), 5G NR, WLAN (for instance, Wi-Fi), WPAN (for instance, Bluetooth and ZigBee), WMAN (for instance, WiMax), and/or GPS technologies.

The transceiver 902 generates RF signals for transmission and processes incoming RF signals received from the antenna 904. It will be understood that various functionalities associated with the transmission and receiving of RF signals can be achieved by one or more components that are collectively represented in FIG. 16 as the transceiver 902. In one example, separate components (for instance, separate circuits or dies) can be provided for handling certain types of RF signals.

The front-end system 903 aids is conditioning signals transmitted to and/or received from the antenna 904. In the illustrated embodiment, the front-end system 903 includes one or more of a power amplifier (PA) 911, a low noise amplifier (LNA) 912, a filter 913, switches 914, a reactive loopback impedance 11 and/or a shared back switch 18. However, other implementations are possible.

For example, the front-end system 903 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 900 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antenna 904 can correspond to one or more antennas used for a wide variety of types of communications. For example, the mobile device 900 can include antennas for transmitting and/or receiving signals associated with a wide variety of frequencies and communications standards.

In certain implementations, the mobile device 900 includes antennas that support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 900 can operate with beamforming in certain implementations. For example, the front-end system 903 can include phase shifters having variable phase controlled by the transceiver 902. Additionally, the phase shifters are controlled to provide beam formation and directivity for transmission and/or reception of signals.

The baseband system 901 is coupled to the user interface 907 to facilitate processing of various user input and output (I/O), such as voice and data. The baseband system 901 provides the transceiver 902 with digital representations of transmit signals, which the transceiver 902 processes to generate RF signals for transmission. The baseband system 901 also processes digital representations of received signals provided by the transceiver 902. As shown in FIG. 16, the baseband system 901 is coupled to the memory 906 of facilitate operation of the mobile device 900.

The memory 906 can be used for a wide variety of purposes, such as storing data and/or instructions to facilitate the operation of the mobile device 900 and/or to provide storage of user information.

The power management system 905 provides a number of power management functions of the mobile device 900. In certain implementations, the power management system 905 includes a PA supply control circuit that controls the supply voltages of the power amplifiers 911. For example, the power management system 905 can be configured to change the supply voltage(s) provided to the power amplifier 911 to improve efficiency, such as power added efficiency (PAE).

As shown in FIG. 16, the power management system 905 receives a battery voltage from the battery 908. The battery 908 can be any suitable battery for use in the mobile device 900, including, for example, a lithium-ion battery.

Front-end systems can be included in various electronic devices, including, but not limited to consumer electronic products, parts of the consumer electronic products, electronic test equipment, etc. Examples of the electronic devices can also include, but are not limited to, circuits of communication networks. The consumer electronic products can include, but are not limited to, a mobile phone, a tablet, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A front-end system comprising:
a plurality of ports including a first transmit port, a second transmit port, a receive port, and an antenna port;
a plurality of radio frequency switches including a first loopback selection switch, a second loopback selection switch, and a shared back switch; and
a plurality of loopback impedances including a first loopback impedance connected between the first transmit port and the receive port by way of the first loopback selection switch and the shared back switch, and a second loopback impedance connected between the second transmit port and the receive port by way of the second loopback selection switch and the shared back switch.

2. The front-end system of claim 1 further comprising a shared termination circuit connected between a first end of the shared back switch and ground, and a receive port DC blocking capacitor connected between a second end of the shared back switch and the receive port.

3. The front-end system of claim 2 wherein the shared termination circuit includes a termination resistor and a termination capacitor electrically connected in series.

4. The front-end system of claim 2 further comprising a first loopback DC blocking capacitor connected between the first end of the shared back switch and the first loopback impedance, and a second loopback DC blocking capacitor connected between the first end of the shared back switch and the second loopback impedance.

5. The front-end system of claim 1 further comprising a first transmit port DC blocking capacitor electrically connected between the first loopback impedance and the first transmit port, and a second transmit port DC blocking capacitor electrically connected between the second loopback impedance and the second transmit port.

6. The front-end system of claim 1 further comprising a low noise amplifier electrically connected between the antenna port and the receive port in a receive path.

7. The front-end system of claim 6 further comprising an input switch electrically connected between an input of the low noise amplifier and the antenna port, and an output switch electrically connected between an output of the low noise amplifier and the receive port.

8. The front-end system of claim 1 wherein the plurality of radio frequency switches further include a first antenna switch electrically connected between the first transmit port and the antenna port, and a second antenna switch electrically connected between the second transmit port and the antenna port.

9. The front-end system of claim 8 further comprising a first antenna port DC blocking capacitor electrically connected in series with the first antenna switch between the first loopback impedance and the antenna port, and a second antenna port DC blocking capacitor electrically connected in series with the second antenna switch between the second loopback impedance and the antenna port.

10. A method of loopback in a front-end system, the method comprising:
transmitting a first transmit signal from a first transmit port to an antenna port;
generating a first loopback signal in response to the first transmit signal using a first loopback impedance connected between the first transmit port and the receive port by way of a first loopback selection switch and a shared back switch;
transmitting a second transmit signal from a second transmit port to the antenna port; and
generating a second loopback signal in response to the second transmit signal using a second loopback impedance connected between the second transmit port and the receive port by way of a second loopback selection switch and the shared back switch.

11. The method of claim 10 further comprising providing termination using a shared termination circuit that is electrically connected between a first end of the shared back switch and ground.

12. The method of claim 10 further comprising transmitting the first transmit signal through a first antenna switch that is between the first transmit port and the antenna port, and transmitting the second transmit signal through a second antenna switch that is between the second transmit port and the antenna port.

13. The method of claim 10 further comprising amplifying a receive signal from the antenna port to generate an amplified receive signal using a low noise amplifier, and providing the amplified receive signal to the receive port.

14. The method of claim 10 further comprising transmitting a third transmit signal from a third transmit port to the antenna port, and generating a third loopback signal in response to the third transmit signal using a third loopback impedance connected between the third transmit port and the receive port by way of a third loopback selection switch and the shared back switch.

15. A packaged module comprising:
a package substrate; and
a semiconductor die attached to the package substrate, the semiconductor die including a first transmit port, a second transmit port, a receive port, an antenna port, a first loopback selection switch, a second loopback selection switch, a shared back switch, a first loopback impedance, and a second loopback impedance, the first loopback impedance connected between the first transmit port and the receive port by way of the first loopback selection switch and the shared back switch, and the second loopback impedance connected between the second transmit port and the receive port by way of the second loopback selection switch and the shared back switch.

16. The packaged module of claim 15 wherein the semiconductor die further includes a shared termination circuit connected between a first end of the shared back switch and ground, and a receive port DC blocking capacitor connected between a second end of the shared back switch and the receive port.

17. The packaged module of claim 16 wherein the shared termination circuit includes a termination resistor and a termination capacitor electrically connected in series.

18. The packaged module of claim 16 wherein the semiconductor die further includes a first loopback DC blocking capacitor connected between the first end of the shared back switch and the first loopback impedance, and a second loopback DC blocking capacitor connected between the first end of the shared back switch and the second loopback impedance.

19. The packaged module of claim 15 wherein the semiconductor die further includes a third transmit port, a third loopback selection switch, and a third loopback impedance, the third loopback impedance connected between the third transmit port and the receive port by way of the third loopback selection switch and the shared back switch.

20. The packaged module of claim 15 wherein the semiconductor die further includes a low noise amplifier electrically connected between the antenna port and the receive port in a receive path.

* * * * *